US007602183B2

(12) United States Patent
Lustig et al.

(10) Patent No.: US 7,602,183 B2
(45) Date of Patent: Oct. 13, 2009

(54) K-T SPARSE: HIGH FRAME-RATE DYNAMIC MAGNETIC RESONANCE IMAGING EXPLOITING SPATIO-TEMPORAL SPARSITY

(75) Inventors: Michael Lustig, Stanford, CA (US);
Juan M. Santos, Stanford, CA (US);
David L Donoho, Setauket, NY (US);
John M. Pauly, Stanford, CA (US)

(73) Assignee: The Board of Trustees of the Leland Stanford Junior University, Palo Alto, CA (US)

( * ) Notice: Subject to any disclaimer, the term of this patent is extended or adjusted under 35 U.S.C. 154(b) by 0 days.

(21) Appl. No.: 12/029,583

(22) Filed: Feb. 12, 2008

(65) Prior Publication Data

US 2008/0197842 A1 Aug. 21, 2008

Related U.S. Application Data

(60) Provisional application No. 60/889,648, filed on Feb. 13, 2007.

(51) Int. Cl.
*G01V 3/00* (2006.01)
(52) U.S. Cl. ........................ 324/309; 324/307
(58) Field of Classification Search ......... 324/300–322; 600/407–445
See application file for complete search history.

(56) References Cited

U.S. PATENT DOCUMENTS

| | | | | |
|---|---|---|---|---|
| 5,653,233 A | * | 8/1997 | Pelc et al. | 600/410 |
| 5,843,139 A | * | 12/1998 | Goedeke et al. | 607/32 |
| 5,873,825 A | * | 2/1999 | Mistretta et al. | 600/410 |
| 6,144,873 A | * | 11/2000 | Madore et al. | 600/410 |
| 6,353,752 B1 | * | 3/2002 | Madore et al. | 600/410 |
| 6,784,664 B2 | * | 8/2004 | Liang et al. | 324/309 |
| 7,302,110 B2 | * | 11/2007 | Chesnokov | 382/264 |
| 2006/0029279 A1 | | 2/2006 | Donoho | |
| 2006/0239336 A1 | | 10/2006 | Baraniuk | |
| 2008/0129298 A1 | * | 6/2008 | Vaughan et al. | 324/322 |
| 2008/0292167 A1 | * | 11/2008 | Todd et al. | 382/131 |

OTHER PUBLICATIONS

Tsao et al: Magnetic Resonance in Medicine 50: 1031-1042 (1003.*
Lustig et al: Magnetic Resonance in Medicine 58: 1182-1195 (2007).*
Donoho et al., "Sparse solution of Underdetermined Linear Equations by Stagewise Orthogonal Matching Pursuit," Stanford University, Department of Statistics, Technical Report 2006-02, Apr. 2006.
Candes et al., "Robust Uncertainty Principles: Exact Signal Reconstruction From Highly Incomplete Frequency Information," IEEE Transactions on Information Theory, vol. 52, No. 2, pp. 489-509, 2006.

(Continued)

*Primary Examiner*—Brij B Shrivastav
(74) *Attorney, Agent, or Firm*—Beyer Law Group LLP

(57) ABSTRACT

A method of dynamic resonance imaging is provided. A magnetic resonance imaging excitation is applied. Data in 2 or 3 spatial frequency dimensions, and time is acquired, where an acquisition order in at least one spatial frequency dimension and the time dimension are in a pseudo-random order. The pseudo-random order and enforced sparsity constraints are used to reconstruct a time series of dynamic magnetic resonance images.

20 Claims, 16 Drawing Sheets

OTHER PUBLICATIONS

Lustig et al., "k-t SPARSE: High frame rate dynamic MRI exploiting spatio-temporal sparsity," Proc. of 14$^{th}$ Annual Meeting of ISMRM, Seattle, p. 2420, 2006.

Donoho, "Compressed Sensing," IEEE Transactions on Information Theory, 52:1289-1306, 2006.

Gamper et al., "Compressed Sensing in Dynamic MRI," Magnetic Resonance in Medicine, 59:365-373, 2008.

Parrish et al, "Continuous Update with Random Encoding (CURE): A New Strategy for Dynamic Imaging," MRM, 33:326-336, 1995.

* cited by examiner

K-T SPARSE: HIGH FRAME-RATE DYNAMIC MAGNETIC RESONANCE IMAGING EXPLOITING SPATIO-TEMPORAL SPARSITY

CROSS REFERENCE TO RELATED APPLICATIONS

This application claims priority under 35 U.S.C. § 119 from U.S. Provisional Patent Application No. 60/889,648, filed Feb. 13, 2007, entitled K-T SPARSE: HIGH FRAME-RATE DYNAMIC MRI EXPLOITING SPATIO-TEMPORAL SPARSITY which is incorporated herein by reference for all purposes.

FEDERALLY-SPONSORED RESEARCH OR DEVELOPMENT

This invention was made with Government support under contracts HL074332, HL067161, EB002969, and RR009784 awarded by the National Institutes of Health. The Government has certain rights in this invention.

BACKGROUND OF THE INVENTION

This invention relates generally to magnetic resonance imaging (MRI), and more particularly the invention relates to MRI with parallel imaging.

Magnetic resonance imaging (MRI) is a non-destructive method for the analysis of materials and is an approach to medical imaging. It is generally non-invasive and does not involve ionizing radiation. In very general terms, nuclear magnetic moments are excited at specific spin precession frequencies which are proportional to the local magnetic field. The radio-frequency signals resulting from the precession of these spins are received using pickup coils. By manipulating the magnetic fields, an array of signals is provided representing different regions of the volume. These are combined to produce a volumetric image of the nuclear spin density of the body.

Magnetic resonance (MR) imaging is based on nuclear spins, which can be viewed as vectors in a three-dimensional space. During an MRI experiment, each nuclear spin responds to four different effects: precession about the main magnetic field, nutation about an axis perpendicular to the main field, and both transverse and longitudinal relaxation. In steady-state MRI experiments, a combination of these effects occurs periodically.

Magnetic Resonance Imaging (MRI) has been very successful in imaging parts of the body that are easily immobilized, such as the brain and joints. Its success has been much more limited for rapidly changing settings, as in imaging the heart and dynamic imaging. MRI requires a relatively long scan time compared to other imaging modalities. This requirement limits and sometimes prevents its use in important applications.

MRI data are collected in the spatial frequency domain (k-space). In most imaging scenarios, scan time is directly related to the number of data samples needed for proper reconstruction. Typically, the k-space sampling density is set by the Nyquist criterion based on the image resolution and field of view (FOV).

US Patent Application 2006/0029279 to Donoho, published on Feb. 9, 2006, entitled "Method and Apparatus For Compressed Sensing," which is incorporated by reference for all purposes, provides a method of approximating a digital signal or image using compressed sensing. US Patent Application 2006/0239336 to Baraniuk et al., published Oct. 26, 2006, entitled "Method and Apparatus For Compressive Imaging Device," which is incorporated by reference for all purposes, provides a method for acquiring an image or video sequence from incoherent projections.

SUMMARY

In accordance with the invention, a method of dynamic resonance imaging is provided. A magnetic resonance imaging excitation is applied. Data in 2 or 3 spatial frequency dimensions, and time is acquired, where an acquisition order in at least one spatial frequency dimension and the time dimension are in a pseudo-random order. The pseudo-random order and enforced sparsity constraints are used to reconstruct a time series of dynamic magnetic resonance images.

In another manifestation of the invention a magnetic resonance imaging apparatus is provided. A magnetic resonance imaging excitation and detection system is provided. A controller is electrically connected to the magnetic resonance imaging excitation and detection system. The controller comprises a display, at least one processor, and computer readable media. The computer readable media comprises computer readable code for applying a magnetic resonance imaging excitation, computer readable code for acquiring data in 2 or 3 spatial frequency dimensions, and time, where an acquisition order in at least one spatial frequency dimension and the time dimension are in a pseudo-random order, computer readable code for using the pseudo-random order and enforced sparsity constraints to reconstruct a time series of dynamic magnetic resonance images, and computer readable code for displaying the time series of dynamic magnetic resonance images on the display.

The invention and objects and features thereof will be more readily apparent from the following detailed description and appended claims when taken with the drawings.

DETAILED DESCRIPTION OF ILLUSTRATIVE EMBODIMENTS

Figure 1:
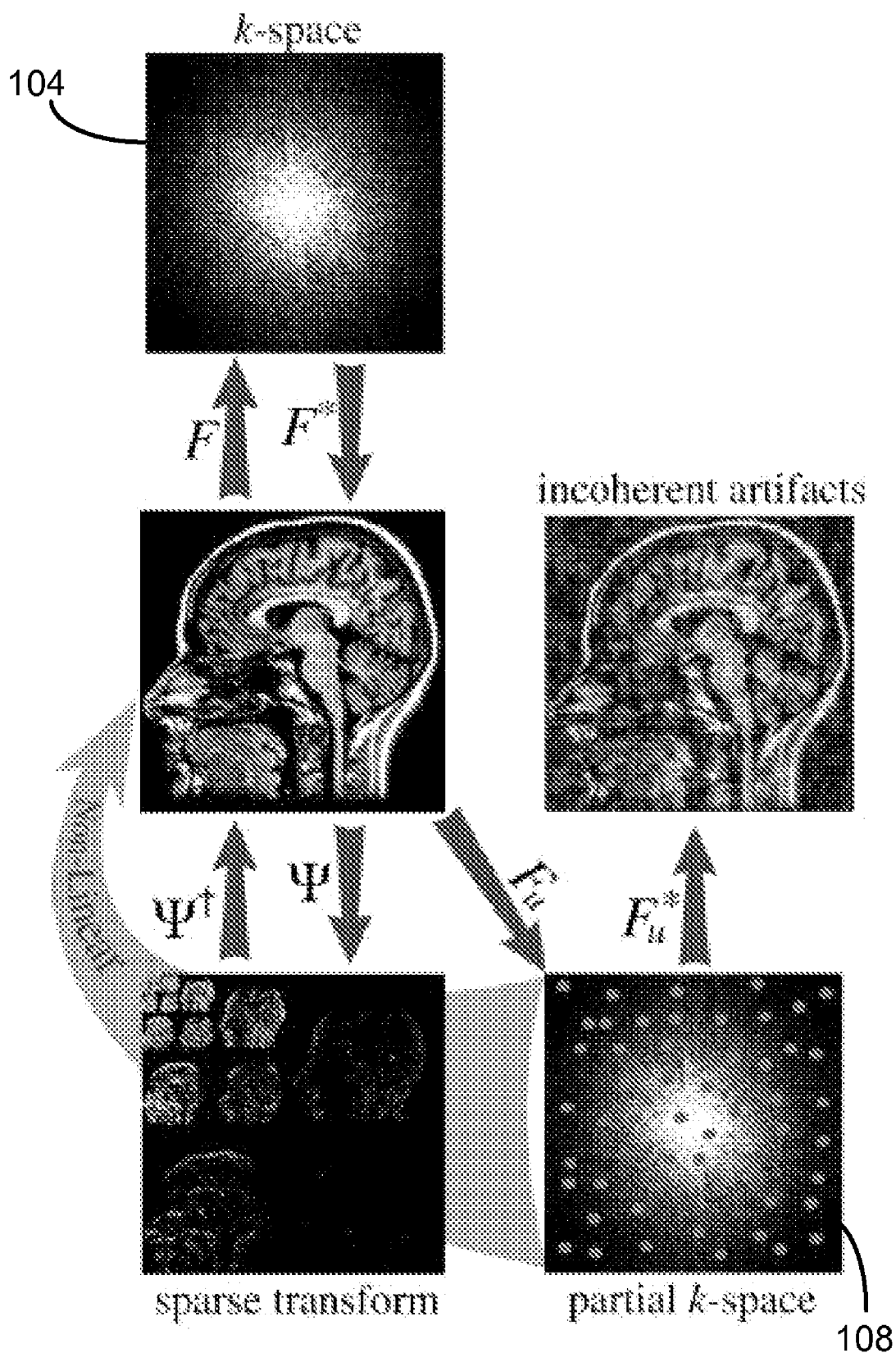
FIG. 1 shows a spatial image domain and a full k-space, as well as a transform domain and an under-sampled k-space.

The MRI data acquisition can be accelerated by undersampling k-space—simply collecting fewer data samples. When k space is undersampled, the Nyquist criterion is violated, and Fourier re-constructions exhibit aliasing artifacts. Many previous proposals for rapid imaging try to mitigate undersampling artifacts. They fall in three groups: (a) Methods generating artifacts that are in-coherent or less visually apparent, at the expense of reduced SNR; (b) Methods exploiting redundancy in k-space, such as partial-Fourier, parallel imaging etc; and (c) Methods exploiting either spatial or temporal redundancy or both.

An embodiment of this invention exploits the sparsity which is implicit in MR images, and develops an approach combining elements of approaches a and c. Implicit sparsity means transform sparsity, i.e., when the underlying object to recover happens to have a sparse representation in a known and fixed mathematical transform domain. To begin with, the identity transform is considered, so that the transform domain is simply the image domain itself. Here sparsity means that there are relatively few pixels with nonzero values. For example, angiograms are extremely sparse in the pixel representation. More complex medical images may not be sparse in the pixel representation, but they do exhibit transform sparsity since they have a sparse representation in terms of spatial finite differences, in terms of their wavelet coefficients, or in terms of other transforms.

Sparsity is a powerful constraint, generalizing the notion of finite object support. It is by now well understood why support constraints in image space (i.e., small FOV) enable sparser sampling of k-space. Sparsity constraints are more general because nonzero coefficients do not have to be bunched together in a specified region. Transform sparsity is even more general because the sparsity needs only to be evident in some transform domain, rather than in the original image (pixel) domain. Sparsity constraints, under the right circumstances, can enable sparser sampling of k-space as well.

The possibility of exploiting transform sparsity is motivated by the widespread success of data compression in imaging. Natural images have a well-documented susceptibility to compression with little or no visual loss of information. Medical images are also compressible, though this topic has been less thoroughly studied. Underlying the most well-known image compression tools such as JPEG, and JPEG-2000 are the Discrete Cosine transform (DCT) and wavelet transform. These transforms are useful for image compression because they transform image content into a vector of sparse coefficients; a standard compression strategy is to encode the few significant coefficients and store them, for later decoding and reconstruction of the image.

The widespread success of compression algorithms with real images raises the following questions: Since the image intended to be acquired will be compressible, with most transform coefficients negligible or unimportant, is it really necessary to acquire all that data in the first place? Could the compressed information simply be measured directly from a small number of measurements, and yet still be reconstruct to the same image which would arise from the fully sampled set?

A substantial body of mathematical theory has recently been published establishing the possibility to do exactly this, regarding compressed sensing (CS) or compressive sampling. According to these mathematical results, if the underlying image exhibits transform sparsity, and if k-space undersampling results in incoherent artifacts in that transform domain, then the image can be recovered from randomly undersampled frequency domain data, provided an appropriate nonlinear recovery scheme is used.

It is possible to develop an intuitive understanding of the phenomena driving CS. The random k-space undersampling induces incoherent artifacts which act as additive noise-like interference in the sparse transform domain. The desired image has a few significant transform coefficients which extend above the interference. These coefficients can be recovered using a non-linear "denoising" procedure, effectively recovering the image itself.

An embodiment of the invention provides a framework for using CS in MRI. One example of this embodiment uses Cartesian sampling. Since most of product pulse sequences in the clinic today are Cartesian, the impact of Cartesian CS is substantial. In other embodiments, non Cartesian CS has great potential and may be advantageous in some applications.

This application discusses the general ideas behind CS and tries to develop intuition as to why CS is indeed possible. Then the application discusses practical implementations of CS, showing examples for 2D, 2D multi-slice and 3D imaging. This application provides tools to analyze the incoherency generated by different types of sampling and transforms. This application then describes the reconstruction and MRI specific issues such as phase correction. Then, this application demonstrates the application of CS to multi-slice FSE imaging, and 3D magnetic resonance angiography (MRA). Then this application shows simulations as well as experimental results offering good reconstructions from heavily undersampled k-space.

Theory

Compressed Sensing

In compressed sensing (CS) a small number of random linear combinations of the signal values—much smaller than the number of signal samples nominally defining it is measured. The signal is reconstructed with good accuracy from these measurements by a non-linear procedure. In MRI, a special case of CS is looked at, where the sampled linear combinations are simply individual Fourier coefficients (k-space samples). In that setting, CS is claimed to be able to make accurate reconstructions from a small subset of k-space, rather than an entire k-space grid.

The CS approach requires that; (a) the desired image have a sparse representation in a known transform domain (i.e., is compressible), (b) the aliasing artifacts, due to k-space undersampling, in that transform domain be incoherent (noise-like), (c) a non-linear reconstruction be used to enforce both sparsity of the image representation and consistency with the acquired data.

To help keep in mind these ingredients, FIG. 1 portrays some of the main objects. FIG. 1 shows the spatial image domain and the full k-space 104, as well as a transform domain and an under-sampled k-space 108. FIG. 1 also shows the standard operators connecting these domains. The requirements of CS refer to (a) sparsity in the transform domain, (b) incoherence of the undersampling artifacts in the transform domain and (c) the need for nonlinear algorithms to go backwards from partial k-space data to reconstructed images.

Intuitive Example by Successive Interference Cancellation

To get an intuition for the feasibility of CS, consider a 1D signal, 256 samples long, which is sparse in the signal domain—i.e. only has few nonzero values—and is under-sampled in k-space by a factor of eight. Hence, assume for the moment that the transform domain is simply the identity. Later, the case where the transform is nontrivial will be considered.

Figure 2:
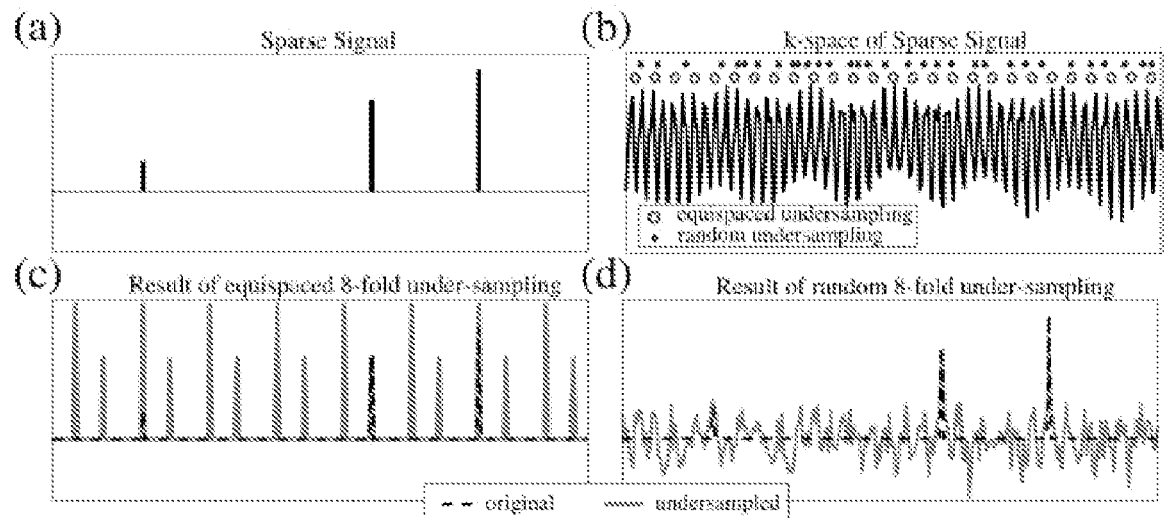
FIGS. 2a-d illustrate a sparse 1D signal.

FIGS. 2a-b depicts the sparse 1D signal in the spatial domain (FIG. 2a) and its 1D k-space signal in the frequency domain (FIG. 2b). When a signal is under-sampled in k-space and reconstructed by zero-filling the missing k-space values, the result will exhibit artifacts superposed on the desired signal; the artifacts depend on the type of undersampling.

For equispaced undersampling, the result is folding, a superposition of shifted replicas of the signal as illustrated in FIG. 2c, where the result is distorted. In this case, there is an inherent ambiguity; it is not possible to distinguish between the original signal and its replicas, as they are all equally likely.

For random undersampling, the situation is very different. The Fourier reconstruction exhibits incoherent artifacts that actually behave much like additive random noise. Despite appearances, the artifacts are not noise; rather, undersampling causes leakage of energy away from each individual nonzero coefficient of the original signal. This energy appears in other reconstructed signal coefficients, including those which had been zero in the original signal. It is possible, if all the underlying original signal coefficients are known, to calculate this leakage analytically. This observation enables the signal in FIG. 2d to be accurately recovered although it was 8-fold undersampled.

Figure 3:
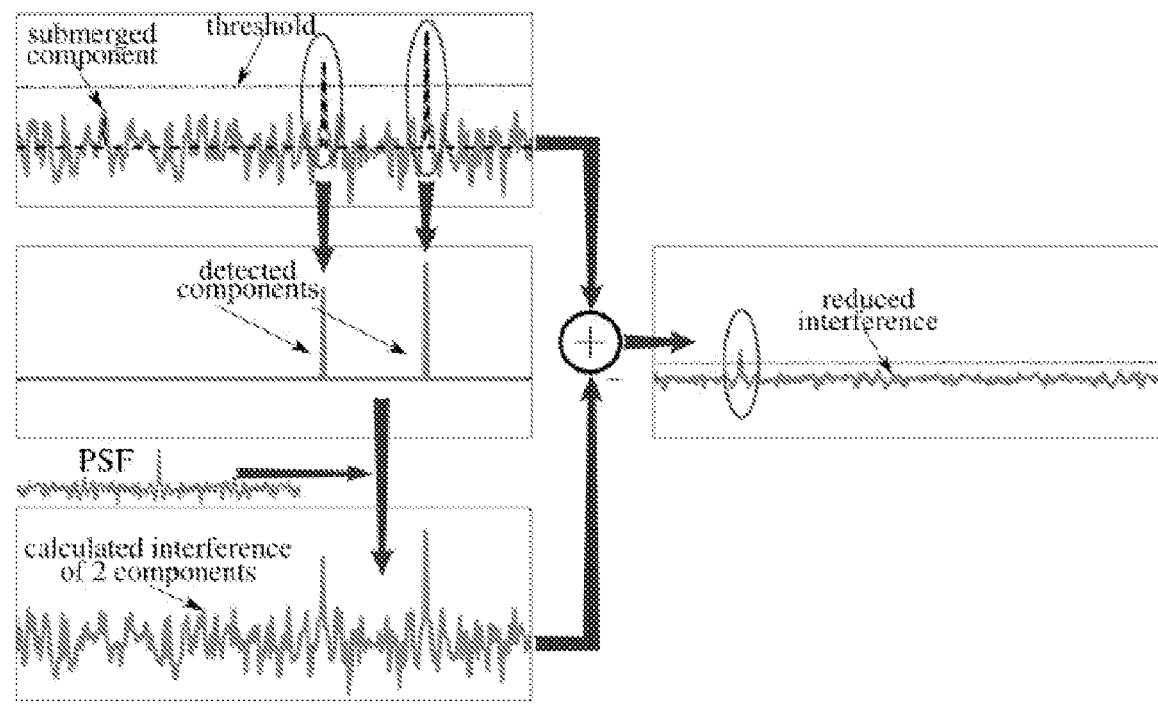
FIG. 3 illustrates an intuitively plausible recovery procedure.

An intuitively plausible recovery procedure is illustrated in FIG. 3. The signal is sparse and the k-space data were randomly undersampled; the Fourier reconstruction exhibits noise-like interference. Since the signal is randomly under-sampled, the interference is incoherent. Some of the large signal components stand out above the level of the interference, and some others are submerged beneath it. By setting an appropriate threshold, the strong components can be detected and then recovered.

Recall that the interference in the measured coefficients appears as random noise, but is not really random. The interference caused by the already-recovered components can be calculated analytically (see Eq. 3) by convolving with the sampling point spread function (PSF). Once computed, the calculated interference due to those components can be subtracted. In practice, this reduces the total interference level and enables recovery of the weaker, previously submerged components. This procedure is repeated until all the significant signal components are recovered. A recovery procedure along the lines just described was proposed in a technical report by Donoho et al. ("Sparse Solution of Underdetermined Linear Equations by Stagewise Orthogonal Matching Pursuit," Standord University, Department of Statistics, Technical report 2006-02) as a fast approximate algorithm for CS reconstruction.

Sparsity

There are two ways to express the mathematical notion of sparsity of a vector of coefficients. In strong sparsity most of the coefficients are required to be exact zeros; this can be quantified by the fraction of nonzero entries. In weak sparsity most of the coefficients are very small, but need not be exactly zero; this can be quantified by the rate at which the sorted nonzero amplitudes decay. For real data, it is rare for transform coefficients to be exactly zero; hence, in MR imaging weak sparsity is the better model. For mathematical analysis in compressed sensing, the conclusions are frequently stronger and the arguments more transparent when strong sparsity is assumed, so it is helpful to keep both models in mind.

Sparsifying Transform

A sparsifying transform is an operator mapping a vector of image data to a sparse vector. Various transformations that can sparsify many different type of images are known.

For example, piecewise constant images can be sparsely represented by spatial finite-differences; indeed, away from boundaries, the differences vanish. Real-life MRI images are of course not piecewise smooth. But in some problems, where boundaries are the most important information (angiograms for example) computing finite-differences results in a sparse representation. In the context of CS, sparse representation by finite-differences leads to algorithms based on the total-variation (TV) penalty in image processing.

Natural, real-life images are known to be sparse in the discrete cosine transform (DCT) and wavelet transform domains. The DCT is central to the JPEG image compression standard and MPEG video compression, and is used to represent images and videos. Natural images can often be compressed with little or no perceptible loss of information. The World-Wide-Web demonstrates this. Transform-based compression is a widely used strategy adopted in the JPEG, JPEG-2000, and MPEG standards. This strategy first applies a sparsifying transform, mapping image content into a vector of sparse coefficients, and then encodes the sparse vector by approximating the most significant coefficients and ignoring the smaller ones. The discrete wavelet transform (DWT) is a common sparsifying transform and is at the heart of JPEG-2000. It is particularly attractive because the wavelet coefficients carry both spatial position and spatial frequency information at the same time.

Figure 20:
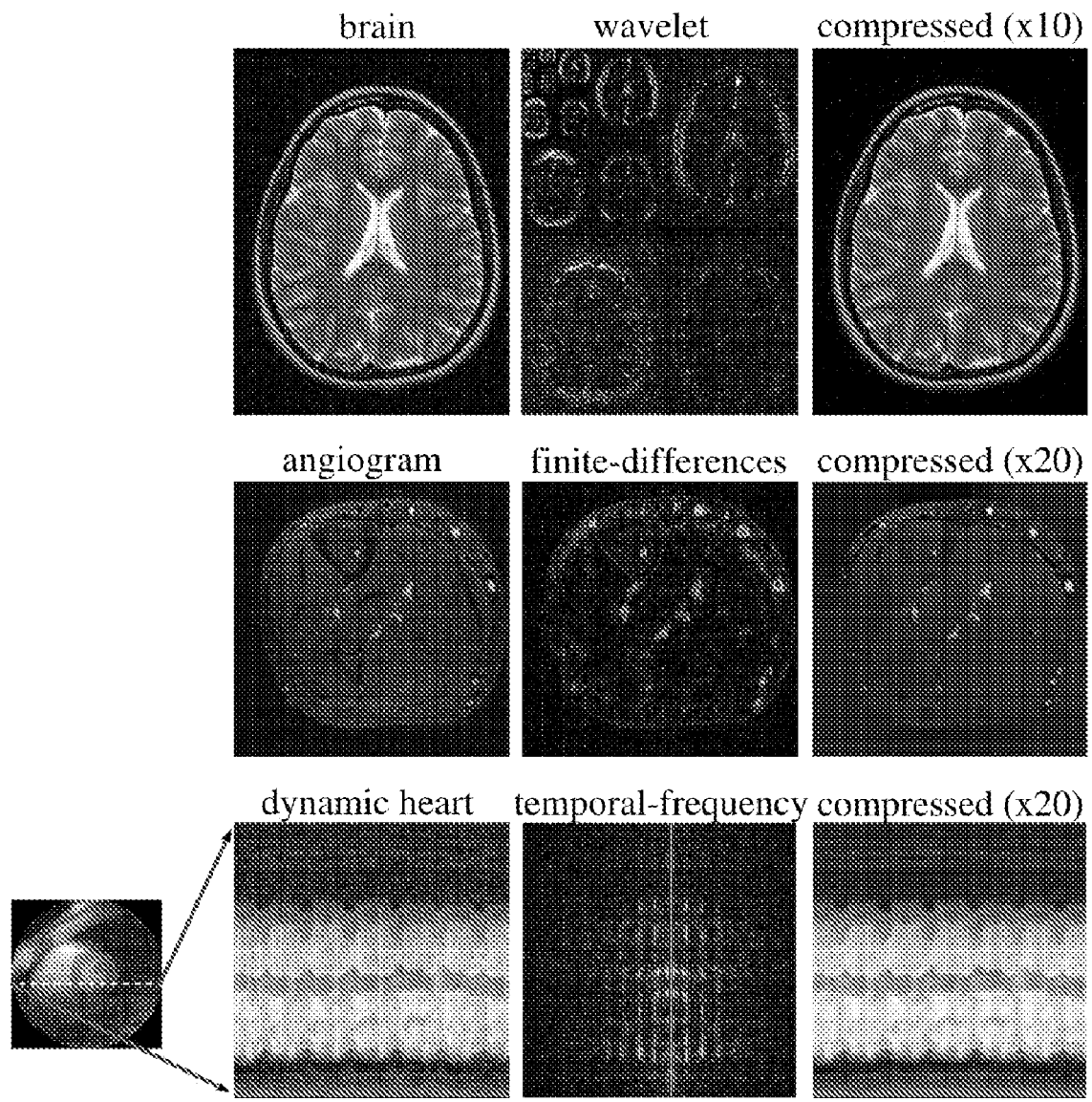
FIG. 20 illustrates transform sparsity of MR images.

Most MR images are sparse in an appropriate transform domain, such as the MR images in FIGS. 20a-c. FIG. 20a shows fully sampled images. The fully mapped images of FIG. 20a are mapped by a sparsifying transform to a transform domain, as shown in FIG. 20b, where several largest coefficients are preserved while all other coefficients are set to zero. The transform is inverted forming reconstructed images, as shown in FIG. 20c. Angiograms, which are images of blood vessels, contain primarily contrast-enhanced blood vessels in a sea of void and already look sparse in the pixel representation. Angiograms can be made even sparser by spatial finite-differencing. More complex imagery, such as brain images, can be sparsified in more sophisticated domains, such as the wavelet domain. Sparse representation is not limited to still imagery. Often videos can safely be compressed much more heavily. This is demonstrated by the success of MPEG. Dynamic MR images are highly compressible as well. For example, the quasi-periodicity of heart images has a sparse temporal Fourier transform.

The Sparsity of MR Images

The transform sparsity of MRI images can be demonstrated by applying a sparsifying transform to a fully sampled image and reconstructing an approximation to the image from a subset of the largest transform coefficients. The sparsity of the image is the percentage of transform coefficients sufficient for diagnostic-quality reconstruction. Although the term 'diagnostic quality' is subjective, for specific applications it is possible to get an empirical sparsity estimate by performing a clinical trial and evaluating reconstructions of many images quantitatively or qualitatively.

Figure 4:
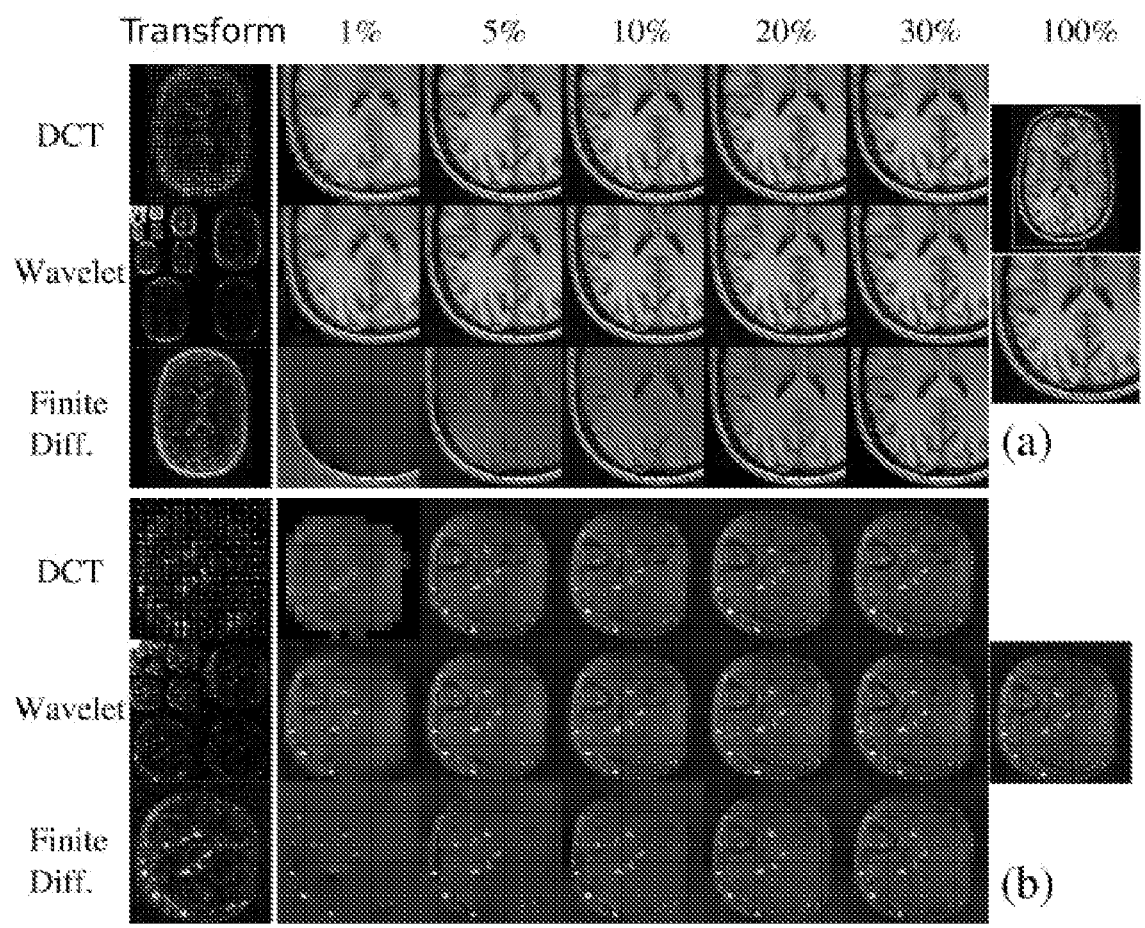
FIGS. 4a-b show the results of MRI angiogram and brain imaging.

To illustrate this, such an experiment was performed on two representative MRI images: an angiogram of a leg and a brain image. The images were transformed by each transform of interest and reconstructed from several subsets of the largest transform coefficients. The results are depicted in FIGS. 4a-b. The left column images show the magnitude of the transform coefficients; they illustrate that indeed the transform coefficients are sparser than the images themselves. The DCT and the wavelet transforms have similar good performance with a slight advantage for the wavelet transform for both brain and angiogram images at reconstructions involving 5-10% of the coefficients. The finite-difference transform does not sparsify the brain image well; in such textured images, adjacent pixels are nearly always different. Nevertheless, finite differences do sparsify angiograms because they primarily detect the boundaries of the blood vessels, which occupy less than 5% of the spatial domain. For this simple example the sparsity of the brain image in the wavelet domain is roughly 10-20% and the sparsity of the angiogram is roughly 5%.

Incoherent Sampling: "Randomness is Too Important to be Left to Chance"

Incoherent aliasing interference in the sparse transform domain is an essential ingredient for CS. In Candès E, Romberg J, Tao T. "Robust uncertainty principles: Exact signal reconstruction from highly incomplete frequency information," IEEE Transactions on Information Theory 2006; 52:489-509 and Donoho D. "Compressed sensing," IEEE Transactions on Information Theory 2006; 52:1289-1306, both which are incorporated by reference for all purposes, sampling a completely random subset of k-space was chosen to simplify the mathematical proofs and in particular to guarantee a very high degree of incoherence.

Random k-space sampling in all dimensions is generally impractical because of hardware and physical considerations. Instead, an embodiment of the invention provides a practical incoherent sampling scheme that mimics the interference properties of pure random undersampling as closely as possible yet allows rapid collection of data.

There are numerous ways to design incoherent sampling trajectories. In order to focus and simplify the discussion, this embodiment of the invention considers only the case of Cartesian grid sampling where the sampling is restricted to undersampling the phase-encodes and fully sampled readouts. Alternative sampling trajectories are possible, such as radial imaging and spiral imaging.

Cartesian sampling is by far the most widely used in practice. It is simple and also highly robust to numerous sources of imperfection. Non uniform undersampling of phase encodes in Cartesian imaging has been proposed in the past as an acceleration method because it produces incoherent artifacts. Undersampling phase-encode lines offers pure randomness in the phase-encode dimensions, and a scan time reduction that is exactly proportional to the undersampling. Finally, implementation of such undersampling scheme is simple and requires only minor modifications to existing pulse sequences.

Point Spread Function (PSF) Analysis

When designing an incoherent sampling trajectory, how does one guarantee that the choice of sampling is indeed incoherent? Is choosing indices at random is "incoherent enough"? Is one random choice better than other choices? In order to answer these questions, one needs a metric to evaluate the incoherence of the aliasing interference.

The point spread function PSF(i, j) is a natural tool to measure the incoherence. The PSF(i, j) measures the contribution of the unit-intensity pixel at a range of spatial locations (i, j). Under Nyquist sampling, the PSF is a unit impulse function, concentrated entirely at the origin. Undersampling causes the PSF to assume nonzero values at pixels other than the origin. A simple measure to evaluate the incoherence is to look at the side-lobe-to-peak ratio $$SPR = \frac{|PSF(i, j)|}{|PSF(0, 0)|}$$

Figures 5A, 5B:
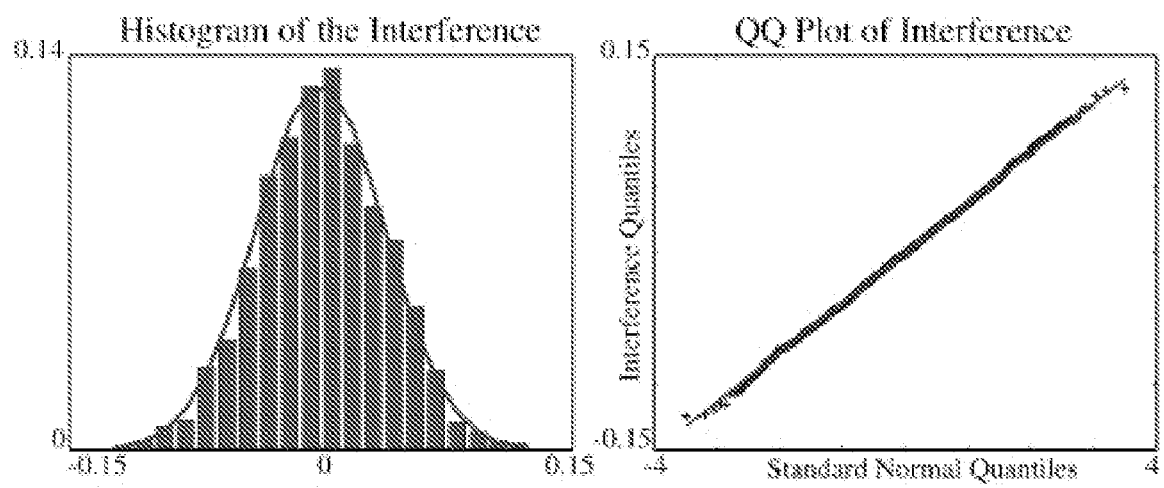
FIGS. 5a-b show an empirical statistical evaluation of interference in a PSF for pure and random sampling.

The PSF of pure 2D random sampling, where samples are chosen at random from a Cartesian grid, can be used as a reference for comparison. In this case the PSF looks random away from the origin. Empirically, the real and the imaginary parts separately behave much like zero-mean random white Gaussian noise, as illustrated in FIG. 5a. FIGS. 5a-b show an empirical statistical evaluation of interference in the PSF for pure random sampling, for a 1D PSF using 2048 samples and 4-fold undersampling. FIG. 5a shows a histogram showing a Gaussian distribution of the off-center point-spread function. FIG. 5b shows a Quantile-Quantile plot (QQ plot) of the off-center point spread versus standard normal distribution. Such a QQ plot is linear, if samples come from a normal distribution. In this case, the plot is close to linear, and therefore the sidelobe values have an approximately normal distribution. The standard deviation of the observed SPR depends on the number, N, of samples taken and the number, D, of grid points defining the underlying image. The standard deviation obeys the formula:

$$\sigma_{SPR} = \sqrt{\frac{D-N}{ND}} \qquad (1)$$

Non grid point sampling, can always be approximated as undersampling an infinitely denser grid. In this case, $D \to \infty$ and the standard deviation increases to $$\sigma_{SPR} \to \frac{1}{\sqrt{N}}.$$

Therefore, it is better from an interference point of view, to undersample on a grid that supports the desired FOV. A derivation of Eq. 1 is given in Appendix II.

For a constant sampling reduction factor p=D/N the standard deviation can be written as $$\sigma_{SPR} = \sqrt{\frac{p-1}{D}} \quad (2)$$

Figure 6:
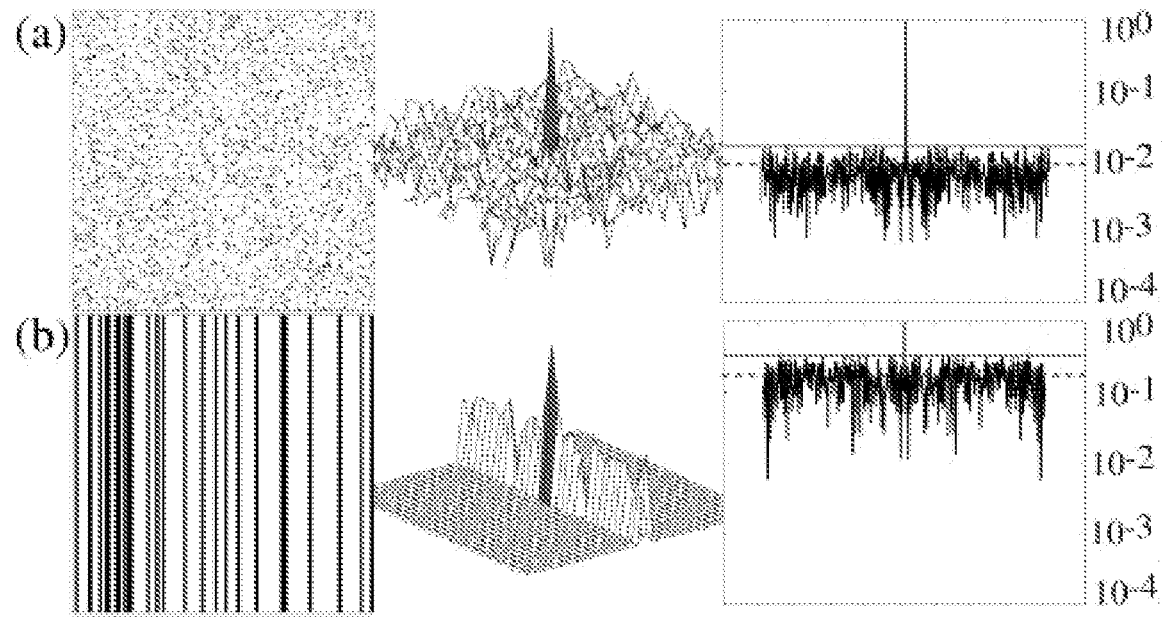
FIGS. 6a-b show a point spread function for 2D and 1D random k-space undersampling.

FIGS. 6a-b show the point spread function (PSF) for 2D and 1D random k-space undersampling (5.5% of 256×256 k-space). FIG. 6a illustrates pure random undersampling, which exhibits incoherent interference. FIG. 6b illustrates randomly undersampled phase-encode lines spread the interference only along a single dimension, therefore the interference is larger. The left column of FIGS. 6a-b show the 2D and 1D undersampling. The middle column illustrates the PSF in logarithmic scale. The right column illustrates the cross-section of the PSF, where the dotted lines mark the theoretical standard deviation of Eq. 2, and thus indicate the theoretical best possible average interference using Eq. 2. The solid lines mark the peak SPR. The lowest peak SPR, as expected, is achieved for the 2D random sampling.

In general, the quantity of real interest is the net interference, convolving the point spread function together with the underlying object. Conceptually, $$\text{Interference}(i, j) = m(i, j) * (\text{PSF}(i, j) - \delta(i, j)) \quad (3)$$

where m is the image to be reconstructed and $\delta(i, j)$ denotes the standard impulse function.

When the nonzero coefficients in m are rare and scattered, the contributions to the interference from different nonzeros add incoherently, and the standard deviation of the interference scales proportionally to the number of nonzeros in the image. However, structured coefficients, or an increase in the number of image components eventually leads to a non-sparse situation, and, at the same time, coherent addition of the interference; this coincides with poor ability to reconstruct the image and should be avoided.

Transform Point Spread Function (TPSF) Analysis

Most of the MR images in embodiments of the invention are sparse in a transform domain rather than the usual image domain. In such a setting, incoherence is analyzed by generalizing the notion of PSF. A Transform Point Spread Function (TPSF) which measures how a single transform coefficient of the underlying object ends up influencing other transform coefficients of the measured undersampled object is needed.

Figure 7:
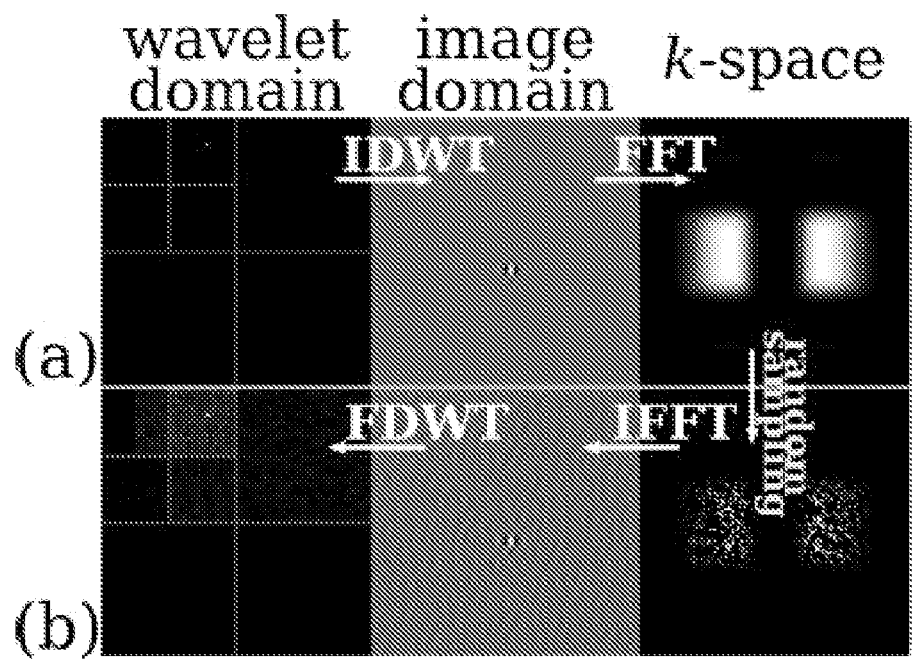
FIGS. 7a-b show a transform point spread for interference in the transform domain.

An example illustrated by FIGS. 7a-b, show a Transform Point Spread (TPSF) for interference in a transform domain. FDWT and IDWT stand for forward and inverse discrete wavelet transform. In FIG. 7a an image with a single nonzero wavelet coefficient is considered and transformed to the frequency domain. It can be seen that a wavelet is localized both in space and spatial frequency. The wavelet coefficients are band-pass filters and have limited support both in space and frequency. In FIG. 7b the k-space is undersampled, and the undersampled Fourier data is transformed back to the wavelet domain. FIG. 7b shows random k-space undersampling results in incoherent interference in the wavelet domain. The left column is not the single nonzero wavelet coefficient that would have been seen with Nyquist sampling; now, at coefficients away from that location, interference can be seen. An interesting feature of wavelet domain TPSF is that the interference of a wavelet coefficient spreads mostly within its wavelet scale and orientation. The reason for it is that wavelets are band-pass filters and are mostly affected by undersampling of their associated frequency band. Therefore, coarse-scale wavelet TPSF is practically unaffected by sampling of the outer k-space and fine scale wavelet TPSF is unaffected by the sampling of the origin of k-space. A formal general mathematical formulation of the TPSF is given in Appendix III.

The size of the side lobes in $\text{TPSF}(i; j)|_{i \neq j}$ can be used as a figure-of-merit for the performance of an incoherent sampling trajectory. $\text{TPSF}(i; j)|_{i \neq j}$ should be as small as possible, and have random noise-like statistics. Another diagnostic is to check that the interference values look normally distributed.

Single-Slice 2DFT, Multi-Slice 2DFT and 3DFT Imaging

Equipped with the PSF and TPSF analysis tools, three cases of Cartesian sampling: 2DFT, multi-slice 2DFT and 3DFT are considered. In single slice 2DFT, only the phase encodes are undersampled and the interference spreads only along a single dimension. The interference standard deviation as calculated in Eq. 2 is $D^{1/4}$ times larger than the theoretical pure random 2D case for the same acceleration—(16 times for a 256×256 image). This is well illustrated in FIGS. 6a-b. Therefore in 2DFT one can expect only modest accelerations because only 1D sparsity is exploited.

Figure 8:
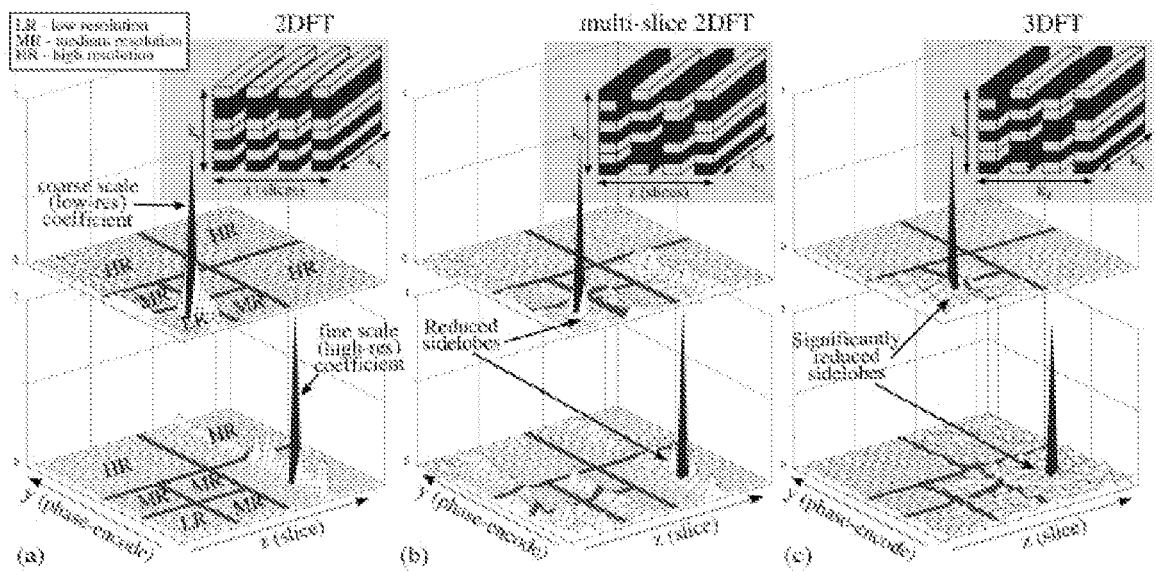
FIGS. 8a-c illustrate a transform point spread function analysis in the wavelet domain.

In Multi-slice 2DFT, it is possible to reduce the peak interference and exploit sparsity in the slice dimension as well. This is done by undersampling in a different way for each of the slices. At first glance, in a conventional PSF analysis, undersampling the k-space of one slice should not affect other slices and aliasing interference from one slice cannot spread to other slices. Indeed, the PSF of multi-slice 2DFT is exactly the same as the plain single-slice 2DFT PSF in FIG. 6b. However, when applying a transform in the phase encode-slice plane (y-z plane), the TPSF may exhibit leakage of interference to nearby slices. To illustrate this consider two cases of a multi-slice acquisitions. In the first, each slice is undersampled in the same way. In the second, for each slice a different random subset of k-space is chosen. In both cases we look at the TPSF in the (y-z plane). In particular, we look at the TPSF of coarse-scale and fine-scale wavelet coefficients. Undersampling the same way for all the slices exhibits exactly the same TPSF as single slice 2DFT—interference spreading only along the y direction as shown in FIG. 8a. Undersampling each slice differently results in a different situation. The interference of the wavelet coefficients now spreads to nearby slices and also to different scales. In particular, the coarse-scale coefficient's TPSF exhibits reduce peak side lobes. The interference however, does not spread to far away slices and the peak side lobe value is higher than in random 2D k-space undersampling.

Randomly undersampling the 3DFT trajectory is used in a preferred embodiment of the invention. Here, it is possible to randomly undersample the 2D phase encode plane ($k_y$-$k_z$) and achieve the theoretical high degree of 2D incoherence. Additionally, 2D sparsity is fully exploited, and images have a sparser representation in 2D. 3D imaging is particularly attractive because it is often time consuming and scan time reduction is a higher priority than 2D imaging.

FIG. 8a illustrates that random phase encode undersampling spreads interference only in 1D and mostly within the same wavelet scale in a transform point spread function (TPSF) analysis in the wavelet domain. The k-space sampling patterns and associated TPSF of coarse-scale and fine-scale wavelet coefficients are shown. The result is relatively high peak interference. FIG. 8b illustrates that sampling differently for each slice, i.e. randomly undersampling the $k_y$-$k_z$ plane causes the interference to spread to nearby slices and to other wavelet scales and reduces its peak value. FIG. 8c illustrates an undersampled 3DFT trajectory and its TPSF.

The $k_y$-$k_z$ plane spread the interference in 2D and results in the lowest peak interference. The peak interference of the wavelet coefficients is significantly reduced compared to multi-slice and plain 2DFT undersampling.

Variable Density Random Sampling

This incoherence analysis so far assumes the few nonzeros are scattered at random among the entries of the transform domain representation. Representations of natural images exhibit a variety of significant non-random structures. First, most of the energy of images is concentrated close to the k-space origin. Furthermore, using wavelet analysis one can observe that coarse-scale image components tend to be less sparse than fine scale. This can be seen in the wavelet decomposition of the brain images in FIG. 4a, which shows an axial $T_1$ weighted brain image and angiogram images in FIG. 4b, which shows an axial 3D TOF contrast enhanced angiogram, left column. FIGS. 4a-b show transform-domain sparsity of images. The images were reconstructed from a subset of 1%, 5%, 10%, 20%, and 30% of the largest transform coefficients (right column).

These observations show that, for a better performance with 'real images', one should be undersampling less near the k-space origin and more in the periphery of k-space. For example, one may choose samples randomly with sampling density scaling according to a power of distance from the origin. Empirically, using a linear or quadratic density greatly reduces the total interference and, as a result, iterative algorithms converge faster with better reconstruction.

Variable-density sampling schemes have been proposed in the past because the aliasing appears incoherent. In such schemes, high energy low frequency image components alias less than lower energy higher-frequency components, and the interference appears as white noise in the image domain. This is exactly the desired case in CS, only in CS it is also possible to remove the aliasing interference without degrading the image quality.

How Many Samples to Acquire?

A theoretical bound on the number of Fourier sample points that need be collected with respect to the number of sparse coefficients is derived in the above mentioned papers by Candès and Donoho (for strong sparsity and pure random sampling). However, it has been observed that in practice, for a good reconstruction, the number of k-space samples should be roughly two to five times the number of sparse coefficients even in the case of weak sparsity. The results in practicing an embodiment of the invention support this claim.

Monte-Carlo Incoherent Sampling Design

Finding an optimal sampling scheme that maximizes the incoherence for a given number of samples is a combinatorial optimization problem and might be considered intractable. However, choosing samples at random often results in a good, incoherent, near-optimal solution. Therefore, an embodiment of the invention provides the following Monte-Carlo design procedure: Choose a grid size based on the desired resolution and FOV of the object. Undersample the grid by constructing a probability density function (pdf) and randomly draw indices from that density. Variable density sampling of k-space is controlled by the pdf construction. A plausible choice is diminishing density according to a power of distance from the origin. Experimentally, linear or quadratic density works well with most types of images. Repeat the procedure a few times, each time measure the peak interference in the TPSF of the resulting sampling pattern. Finally, choose the pattern with the lowest peak interference. Once a sampling pattern is determined it can be used again for future scans.

Image Reconstruction

The processes of nonlinear image reconstruction appropriate to the CS setting will now be described in more detail. Suppose the image of interest is a vector m, let $\Psi$ denote the linear operator that transforms from pixel representation into a sparse representation, and let $F_u$ be the undersampled Fourier transform, corresponding to one of the k-space undersampling schemes discussed earlier. The reconstruction is obtained by solving the following constrained optimization problem:

$$\text{minimize } \|\Psi m\|_1 \quad (4)$$
$$\text{s.t. } \|F_u m - y\|_2 < \varepsilon$$

Here m is the reconstructed image, where y is the measured k-space data from the scanner and $\varepsilon$ controls the fidelity of the reconstruction to the measured data. The threshold parameter $\varepsilon$ is usually set below the expected noise level.

The objective function in Eq. 4 is the $l_1$ norm, which is defined as $\|x\|_1 = \Sigma_i |x_i|$. Minimizing $\|\Psi m\|_1$ promotes sparsity. The constraint $\|F_u m - y\|_2 < \varepsilon$ enforces data consistency. In words, among all solutions which are consistent with the acquired data, Eq. 4 finds a solution which is compressible by the transform $\psi$.

The $l_1$ norm in the objective is a crucial feature of the whole approach. Minimizing the $l_1$ norm of an objective often results in a sparse solution and in some cases the sparsest solution possible. On the other hand, minimizing the $l_2$ norm, which is defined as $\|x\|_2 = (\Sigma_i |x_i|^2)^{1/2}$ and commonly used for regularization because of its simplicity, does not result in a sparse solution and hence is not suitable for uses as objective function in Eq. 4.

Equation 4 is a convex quadratic program (QP) for a real-valued image, and a second order cone program (SOCP) for a complex-valued image, each of which have efficient solver. Special purpose methods for solving Eq. 4 have been a focus of research interest since CS was first introduced. Proposed methods include: interior point methods, projections onto convex sets (Candès et al. "Practical signal recovery from random projections", 2006, Manuscript), iterative soft thresholding, homotopy (Donoho et. al, "Fast solution of $l^1$ minimization where the solution may be sparse" 2006, Manuscript), and iteratively reweighted least squares. Also of interest are greedy heuristic algorithms which do not truly solve the problem in Eq. 4, but often approximate the solution; these include orthogonal matching pursuit and least angle regression.

Low-Order Phase Correction and Phase Constrained Partial k-Space

Figure 9:
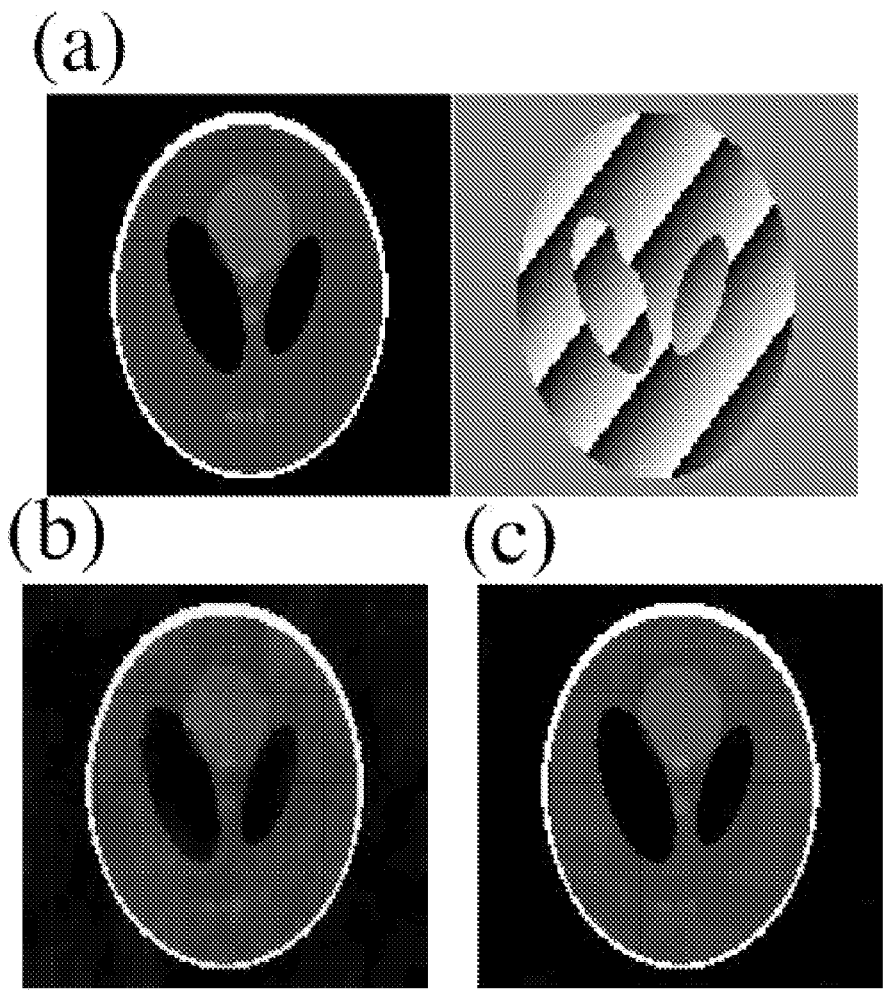
FIGS. 9a-c illustrate how low-order phase correction greatly improves reconstruction.

In MRI, instrumental sources of phasing can cause low-order phase variation. These carry no physical information, but create artificial variation in the image which makes it more difficult to sparsify, especially by finite differences. By estimating the phase variation, the reconstruction can be significantly improved. This phase estimate may be obtained using very low-resolution k-space information. Alternatively, the phase is obtained by solving Eq. 4 to estimate the low-order phase, and repeating the reconstruction while correcting for the phase estimate. The phase information is incorporated by a slight modification of Eq. 4, $$\text{minimum } \|\Psi m\|_1 \quad (5)$$

$$\text{s.t. } \|F_u P m - y\|_2 < \varepsilon$$

where P is a diagonal matrix, representing the low-order phase modulation. FIGS. 9*a-c* show a simulation of a phantom reconstructed with and without a low-order phase correction. The reconstruction using the phase estimate is significantly better. FIG. 9*a* shows the original phantom magnitude and phase images. FIG. 9*b* shows a reconstruction without linear-phase correction, which exhibits residual artifacts. FIG. 9*c* shows a reconstruction with linear-phase correction.

Phase constrained partial k-space has been used clinically for many years to accelerate the scan time by a factor of up to two. The basic idea exploits the conjugate symmetry of the Fourier transform of real-valued images. A phase estimate can be used not only for phase correction, but also to include phase-constrained partial k-space with CS reconstruction. The conjugate Fourier symmetry is obtained by constraining the reconstructed image to be real after the phase correction. This is implemented by a slight modification of Eq. 5

$$\text{minimize } \|\Psi m\|_1 \quad (6)$$

$$\text{s.t. } \|F_u P m - y\|_2 < \varepsilon$$

$$m \in R$$

Noise-Aware Reconstruction and Non-Linear Denoising

The CS methodology is stable in the presence of noise. It has been proven theoretically and by computational experiments that with sufficient image sparsity, the transform domain coefficients are recoverable to within a reasonable multiple of the noise level. In practice, it has been observed that the reconstruction algorithms of the above embodiment performs non-linear denoising of the image. The amount of denoising is controlled by the $\epsilon$ parameter in Eq. 4. The denoising is equivalent to either TV denoising or wavelet denoising depending on the transform used. Both are known to suppress noise while preserving image features. A practical example is presented in the experimental methods section.

Methods

All experiments were performed on a 1.5 T Signa Excite scanner. All CS reconstructions were implemented in Matlab™ using the non-linear conjugate gradient method as described in Appendix I.

Undersampled 2D Cartesian Sampling in the Presence of Noise

To document the performance of CS in the presence of noise, a phantom was scanned using a 2D Cartesian spin-echo sequence with scan parameters chosen such that the data is noisy with a measured SNR=6.17. The k-space was under-sampled by a factor of 2.5 by randomly choosing phase-encodes lines with a quadratic variable density. A CS reconstruction using a TV penalty was obtained, with consistency RMS error of $10^{-5}$ and 0.1. The result was compared to a minimum $l_2$ norm reconstruction from the undersampled data, and the reconstruction based on complete Nyquist sampling. Finally, the image quality as well as the resulting SNR of the reconstructions were compared.

Multi-Slice 2DFT Fast Spin-Echo Brain Imaging

In the theory section it was shown that brain images exhibit transform sparsity in the wavelet domain. Brain scans are a significant portion of MRI scans in the clinic, and most of these are multi-slice acquisitions. To demonstrate the advantage of multi-slice CS over single slice CS and the importance of the TPSF incoherency analysis, a T2-weighted multi-slice k-space data of a brain of a healthy volunteer was acquired using a FSE sequence (256×192×32, res=0.82 mm, slice=3 mm, echo-train=15, TR/TE=4200/85 ms). For each slice acquired different sets of 80 phase-encodes chosen randomly from 192 possible phase encodes, for an acceleration factor of 2.4. The image was CS reconstructed with a wavelet transform as sparsifying a transform. To reduce computation time and memory load, the 3D problem was separated into many 2D CS reconstructions, i.e., iterating between solving for the y-z plane slices, and solving for the x-y plane slices. The multi-slice reconstruction was then compared to a minimum $l_2$ norm reconstruction from the undersampled data as well as to a CS reconstruction where the data was undersampled the same way for all the slices.

Contrast-Enhanced 3D Angiography

Angiography is a very promising application for CS. First, the problem matches the assumptions of CS. Angiograms seem sparse already to the naked eye. The blood vessels are bright with a very low background signal. Angiograms are sparsified very well by both the wavelet transform and by finite-differences. This is illustrated in FIG. 4*b*; blood vessel information is preserved in reconstructions using only 5% of the transform coefficients. Second, the benefits of CS are of real interest in this application. In angiography there is often a need to cover a very large FOV with relatively high resolution, and the scan time is often crucial.

To test the behavior of CS for various degrees of undersampling in a controlled way, k-space data was estimated by computing the Fourier transform of a magnitude post-contrast 3D time-of-flight (TOF) angiogram of the peripheral legs. The scan was RF-spoiled gradient echo (SPGR) sequence with the following parameters: TR=6 ms, TE=1.5 ms, Flip=30°. The acquisition matrix was set to 480×480×92 with corresponding resolution of 1×0.8×1 mm. The imaging plane was coronal with a superior-inferior readout direction.

From the full k space set, five undersampled data sets with corresponding acceleration factors of 5, 6.7, 8, 10, 20 were constructed by randomly choosing phase encode lines with the quadratic variable k-space density. To reduce complexity, prior to reconstruction, a 1D Fourier transform was applied in the fully sampled readout direction. This effectively creates 480 separable purely random undersampled 2D reconstructions.

Finally, the images were reconstructed from the undersampled data by using Eq. 4 with a TV penalty (finite differences). The result was compared to a minimum $l_2$ norm reconstruction (by zero-filling the missing data). The result was also compared to a fully sampled low-resolution acquisition. The low-resolution acquisition obtained centric ordered data with the same number of phase-encodes as the undersampled sets.

This embodiment was further tested with true k-space data on a first-pass abdominal contrast enhance angiogram with the following scan parameters: TR/TE=3.7/0.96 ms, FOV=44 cm, matrix=320×192×32 (with 0.625 fractional echo), BW=125 KHz.

The data was under-sampled 5-fold with a quadratic k-space density effectively reducing the scan time from 22 s to 4.4 s. The images were CS reconstructed from the undersampled data using Eq. 4 with a TV penalty and the result was again compared to a minimum $l_2$ norm and low-resolution reconstructions. To compensate for the fractional echo, a Homodyne partial-Fourier reconstruction, as described in McGibney G, Smith M R, Nichols S T, Crawley, "A. Quantitative evaluation of several partial Fourier reconstruction algorithms used" MRI. Magn Reson Med 1993; 30:51-59, was performed in the readout direction.

Results

2DFT CS Reconstruction in the Presence of Noise

Figure 10:
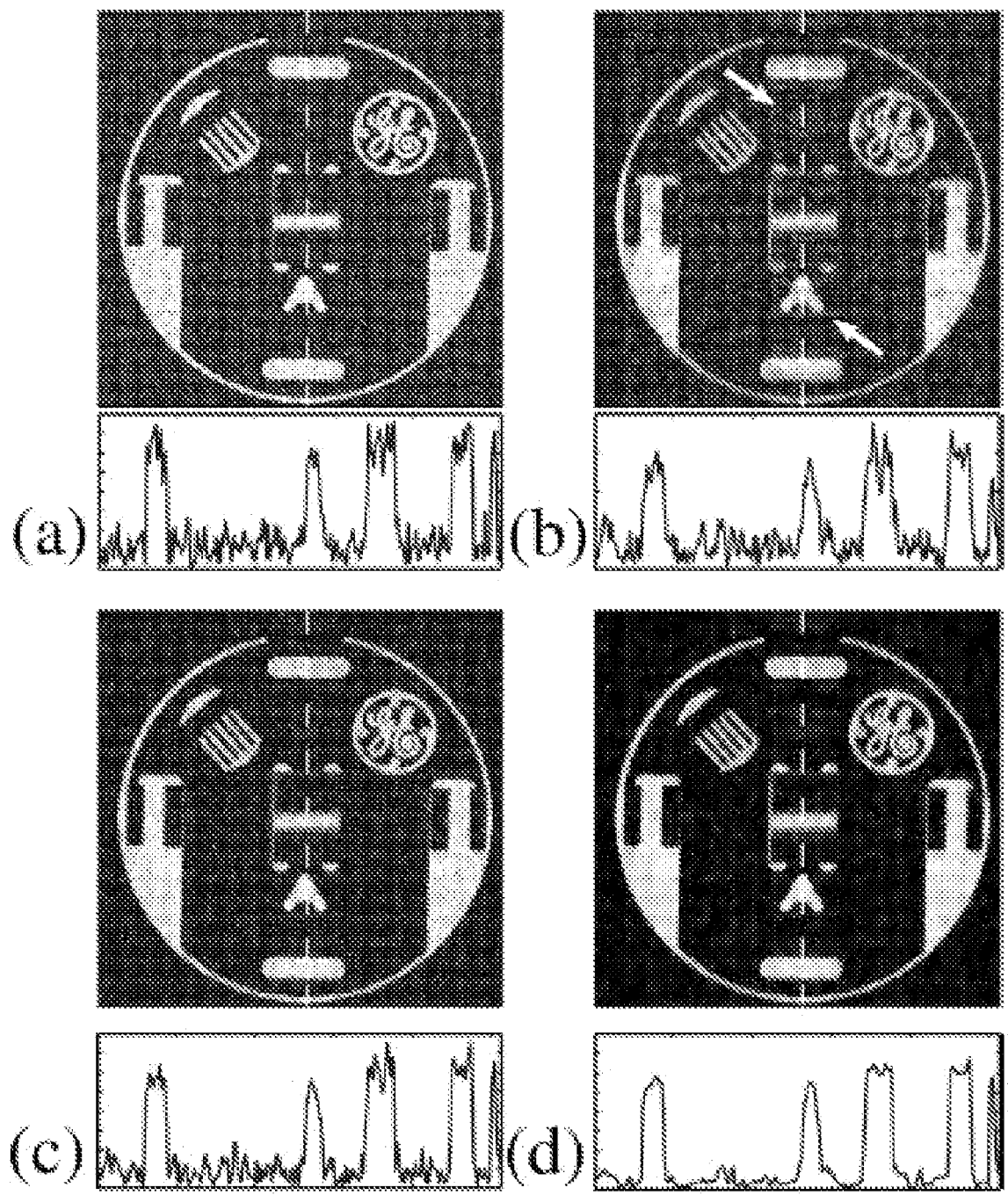
FIGS. 10a-d illustrate a 2DFT CS reconstruction from noisy data.

FIGS. 10a-d present 2DFT CS reconstruction results from noisy data. FIG. 10a shows the reconstruction of a fully sampled phantom scan. The measured SNR is 6.17. The minimum-norm undersampled reconstruction result in FIG. 10b exhibits artifacts due to the undersampling (pointed by arrows) as well as noise for minimum l2 norm reconstruction. The measured SNR is slightly higher SNR=8.9 because a variable density k-space sampling was used. In FIG. 10c the artifacts are suppressed by the CS reconstruction, recovering the noisy image with an SNR of 9.84, where consistency RMS error is set to $10^{-5}$. The SNR is slightly better because the CS reconstruction is inherently a denoising procedure. By increasing the RMS consistency to $\epsilon=0.1$ the CS reconstruction recovers and demises the phantom image. The measured SNR was increased dramatically to 26.9 without damaging the image quality. The denoising is non-linear edge preserving TV denoising and is shown in FIG. 10d.

Multi-Slice Fast Spin-Echo Brain Imaging

Figure 11:
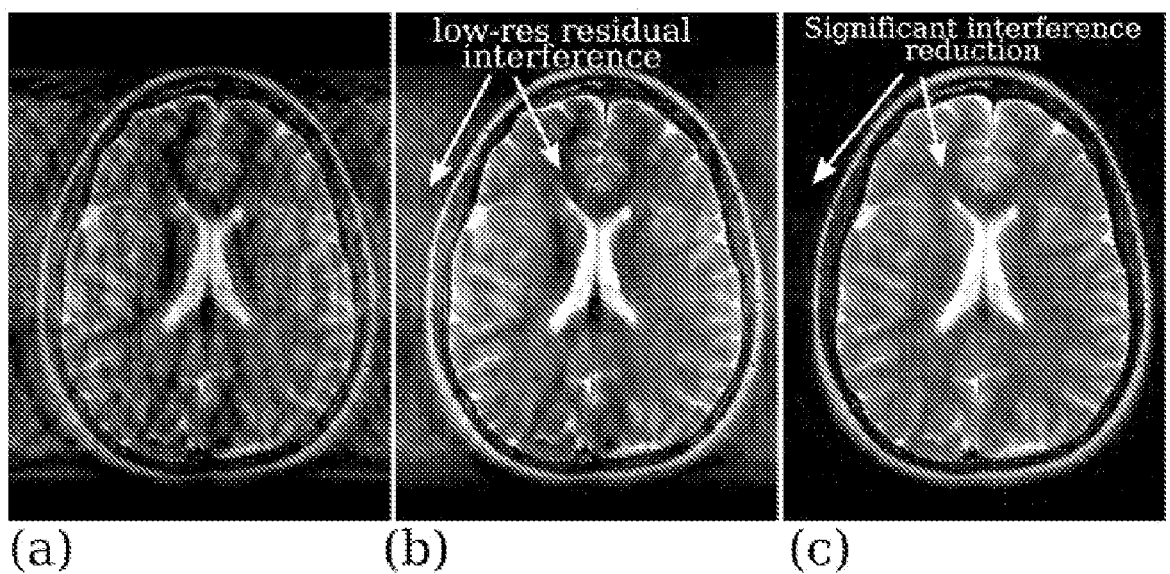
FIGS. 11a-c illustrate a multi-slice 2DFT fast spin echo CS at 2.4 acceleration.

FIGS. 11a-c show the reconstruction results for a multi-slice 2DFT fast spin echo CS at 2.4 acceleration. The linear minimum $l_2$ norm reconstruction in FIG. 11a exhibits severe artifacts due to the undersampling. FIG. 11b shows the CS wavelet reconstruction of data in which each slice was undersampled in the same way. The reconstruction exhibits reduced artifacts; however a significant amount of low-resolution aliasing interference remains. Coarse-scale wavelet components were not recovered correctly because of the large peak interference in the TPSF and because the coarse scale is generally not sparse. FIG. 11c shows the CS wavelet reconstruction from data in which each slice was undersampled differently. Here, significant reduction in the artifacts can be seen in the image because the peak interference in the TPSF of the course scale components is significantly smaller, which enables the recovery of these components.

Contrast Enhanced 3D Angiography

Figure 12:
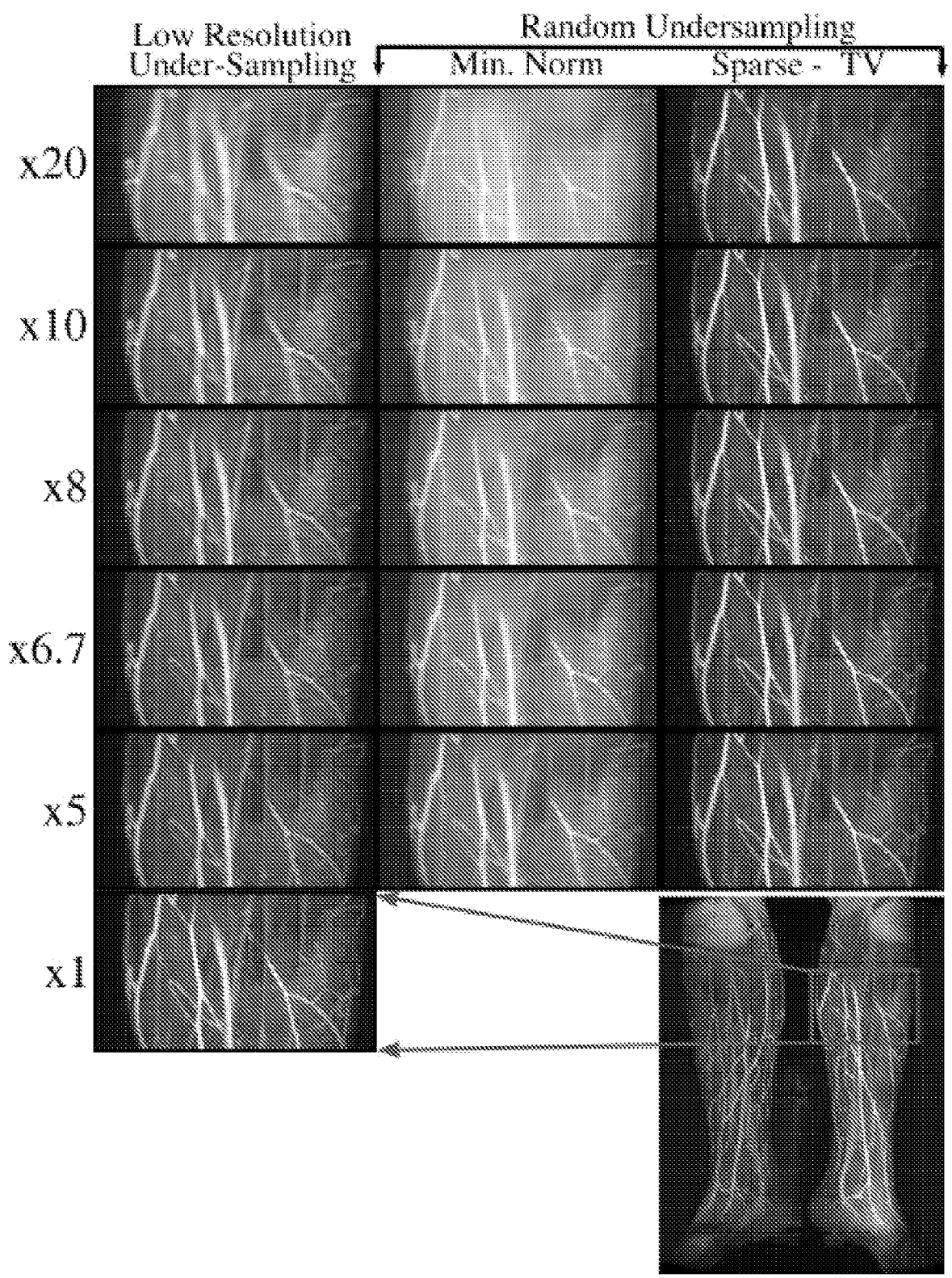
FIG. 12 illustrates a contrast-enhanced 3D angiography reconstruction.

FIG. 12 shows a region of interest in the maximum intensity projection (MIP) of the reconstruction results for a contrast-enhanced 3D angiography reconstruction. The low-resolution reconstruction of central k-space lines (left column), as expected, shows a decrease in resolution with acceleration characterized by loss of small structures and diffused blood vessel boundaries. The minimum-norm reconstruction from randomly undersampled k-space (middle column), exhibits a decrease in SNR due to the incoherent interference, which obscures small and dim vessels. Interestingly, the boundaries of the very bright vessels remain sharp and are diagnostically more useful than the low-resolution. The CS reconstruction with TV penalty from randomly undersampled k-space (right column), on the other hand, exhibits good reconstruction of the blood vessels even at very high accelerations. The resolution as well as the contrast are preserved with almost no loss of information at up to 10-fold acceleration. Even at acceleration of 20-fold the bright blood vessel information is well preserved. These results conform with the thresholding experiment in FIGS. 4a-b.

Figure 13:
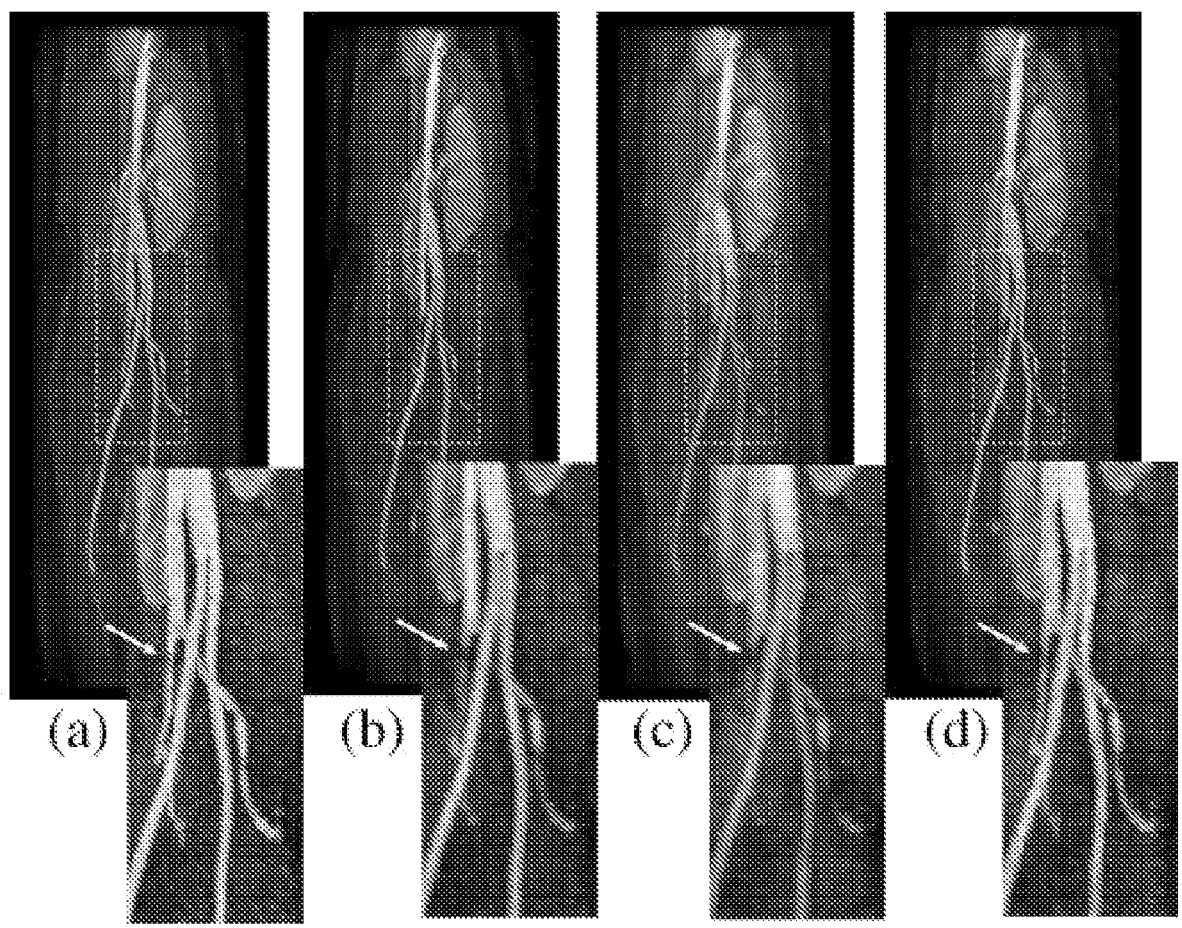
FIGS. 13a-d illustrate a reconstruction from a 5-fold accelerated acquisition of first-pass contrast enhanced abdominal angiography.

FIGS. 13a-d show the reconstruction result from 5-fold accelerated acquisition of the first-pass contrast enhanced abdominal angiography. FIG. 13a is a reconstruction from a complete data set. The imaged patient has an aorto-bifemoral bypass graft. This is meant to carry blood from the aorta to the lower extremities and is seen on the left side of the aorta (right in the image). There is a high grade stenosis in the native right common illiac artery, which is indicated by the arrows. Again, at 5-fold acceleration the low-resolution acquisition exhibits diffused boundaries and the minimum-norm exhibits considerable decrease in SNR. FIG. 13b is a low-resolution image. FIG. 13c is a minimum norm reconstruction from random undersampling. FIG. 13d is a CS reconstruction from random undersampling. The CS reconstruction exhibits a good reconstruction of the blood vessels, in particular, it can be seen that in FIG. 13d flow across the stenosis is visible, but it is not visible in FIGS. 13b-c.

Discussion

Computational Complexity

Fast algorithms for solving Eq. 4 accurately or approximately is an increasingly popular research topic are provided by an embodiment of the invention.

The examples in this paper were reconstructed using a non-linear conjugate gradient method with backtracking linesearch. In a Matlab™ implementation, it takes about two minutes to reconstruct a 256×256 image. Significant reduction in the reconstruction time may be gained by code optimization.

Reconstruction Artifacts

The $l_1$ reconstruction tends to slightly shrink the magnitude of the reconstructed sparse coefficients. The resulting reconstructed coefficients are often slightly smaller than in the original signal. This coefficient shrinkage decreases when the reconstruction consistency parameter $\epsilon$ in Eq. 4 is small.

In some wavelet-based CS reconstructions, small high frequency oscillatory artifacts may appear in the reconstruction. This is due to false detection of fine-scale wavelet components. To mitigate these artifacts it is recommended to add a small TV penalty on top of the wavelet penalty. This can be considered as requiring the image to be sparse in both wavelet and finite-differences transforms.

In CS, the contrast in the image plays a major part in the ability to vastly undersample and reconstruct images. High contrast, often results in large distinct sparse coefficients, these can be recovered even at very high accelerations. For example, a single bright pixel will most likely appear in the reconstruction even with vast undersampling, as shown in FIG. 12. However, features with lower contrast at the same accelerations will be so deeply submerged by the interference that they would not be recoverable. As such, with increased acceleration the most distinct artifacts in CS are not the usual loss of resolution or increase in aliasing interference, but loss of low contrast features in the image. Therefore, CS is particularly attractive in application that exhibit high resolution high contrast image features, and rapid imaging is required.

Relation to Other Acceleration Methods

CS reconstruction exploits sparsity and compressibility of MR images. As such it can be incorporated with other acceleration methods that exploit different redundancies. For example, it has been shown how to incorporate phase constrained partial k-space with the CS reconstruction. In a similar way, CS can be incorporated with SENSE reconstruction by including the coil sensitivity information in Eq. 4. In general, any image that can be expressed as a convex constraint can be incorporated in the reconstruction.

Flow Chart

Figure 14:
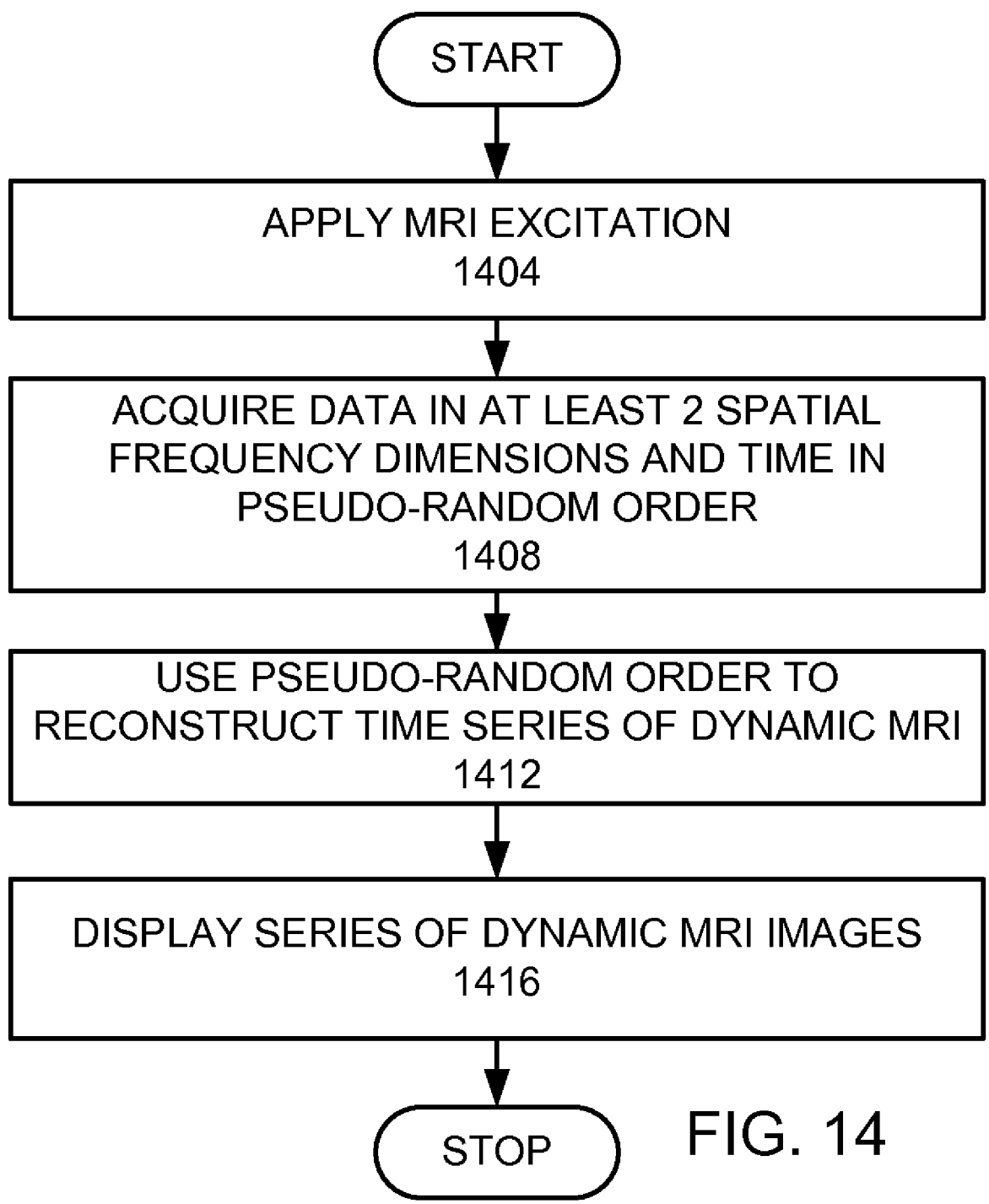
FIG. 14 is a high level flow chart of an embodiment of the invention.
Figure 17:
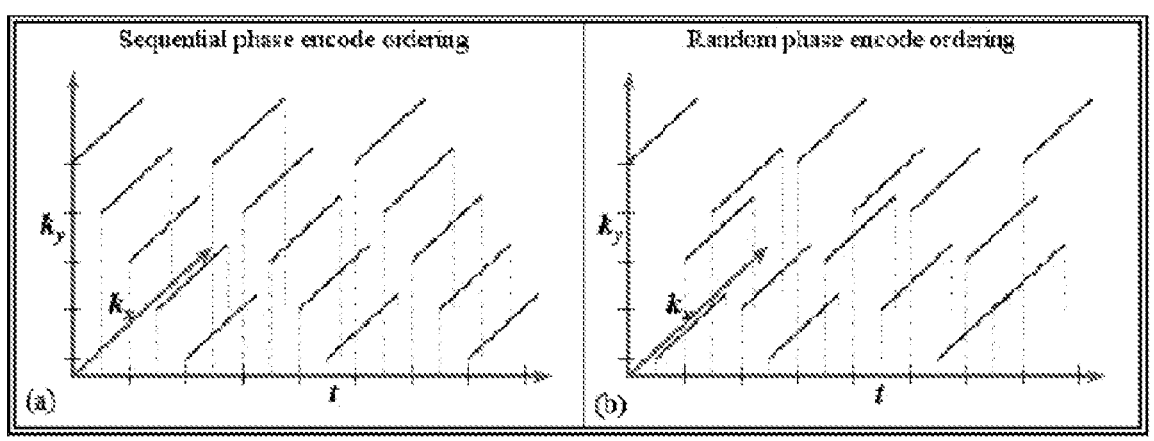
FIGS. 17a-b illustrate sequential phase encode ordering and random phase encode ordering.

FIG. 14 is a high level flow chart of an embodiment of the invention. A magnetic resonance imaging (MRI) excitation is applied (step 1404). Data in at least 2 spatial frequency dimensions and time are acquired, where an acquisition order in at least one spatial frequency dimension and the time dimension are in a pseudo-random order (step 1408). A pseudo random process is a process that appears random but is not. Pseudorandom sequences exhibit statistical randomness while being generated by an entirely deterministic causal process. FIG. 17a illustrates a sequential phase encoding order for a sliding window. It should be noted that the $k_y$ encoding is done in a sequential manner, where for each frame of the sliding window the $k_y$ encoding is done in the same order. FIG. 17b illustrates a random phase encoding, where $k_y$ encoding is not in a sequential order, but instead the k-t space is randomly sampled, which enables recovery of spatio-temporal dynamic scenes using the $l_1$ reconstruction. For each sliding frame the $k_y$ encoding is done if different orders in a pseudo-random manner. The pseudo-random order is used to reconstruct a time series of dynamic magnetic resonance images (step 1412). The dynamic magnetic resonance images are displayed (step 1416).

Figure 15:
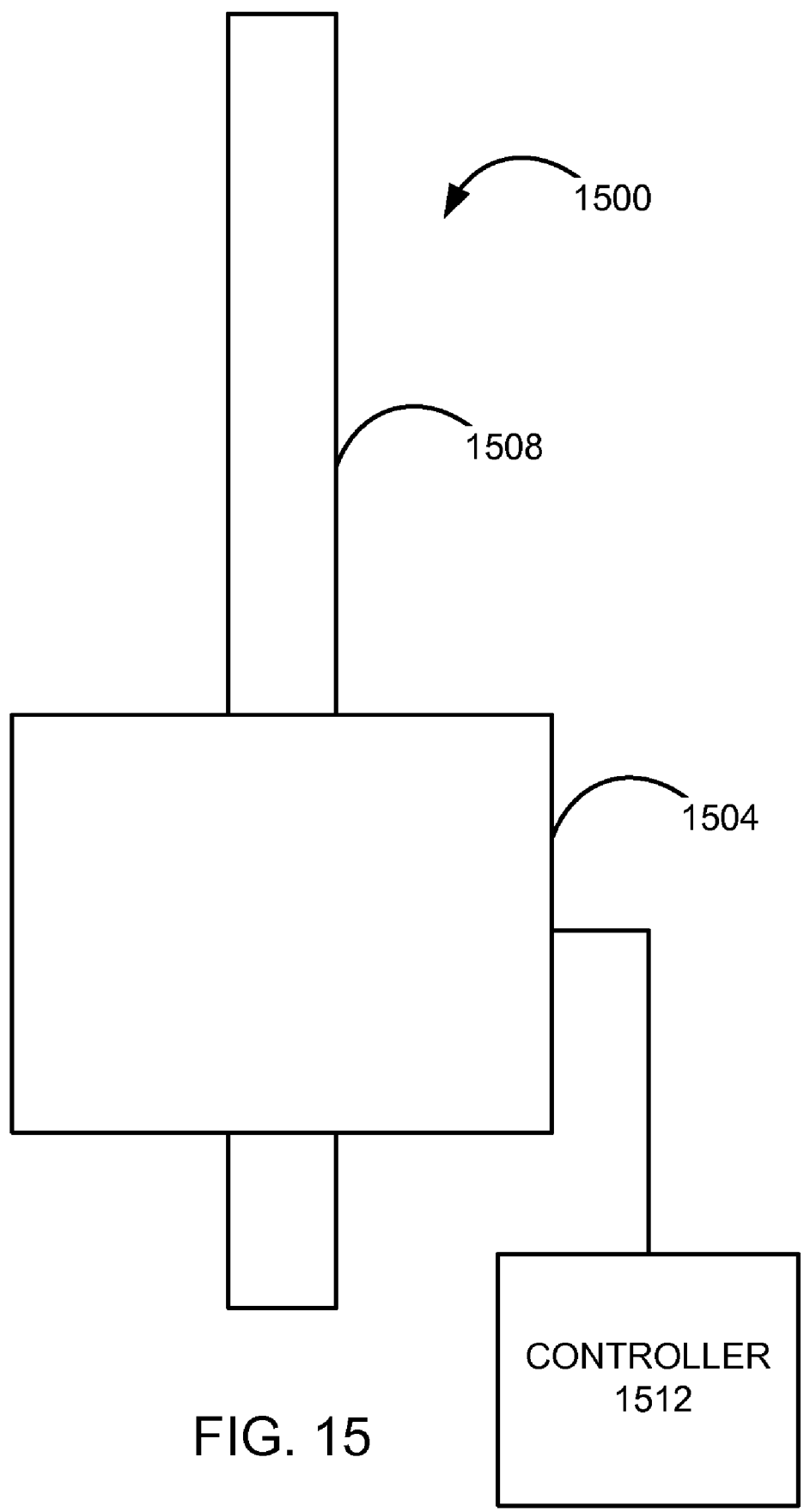
FIG. 15 is a schematic top view of a magnetic resonance imaging (MRI) system.

FIG. 15 is a schematic top view of a magnetic resonance imaging (MRI) system 1500 that may be used in an embodiment of the invention. The MRI system 1500 comprises a magnet system 1504, a patient transport table 1508 connected to the magnet system, and a controller 1512 controllably connected to the magnet system. In one example, a patient would lie on the patient transport table 1508 and the magnet system 1504 would pass around the patient. The controller 1512 would control magnetic fields and radio frequency (RF) signals provided by the magnet system 1504 and would receive signals from detectors in the magnet system 1504. In this example, the magnet system would comprise a plurality of coils for parallel imaging.

Figure 16A:
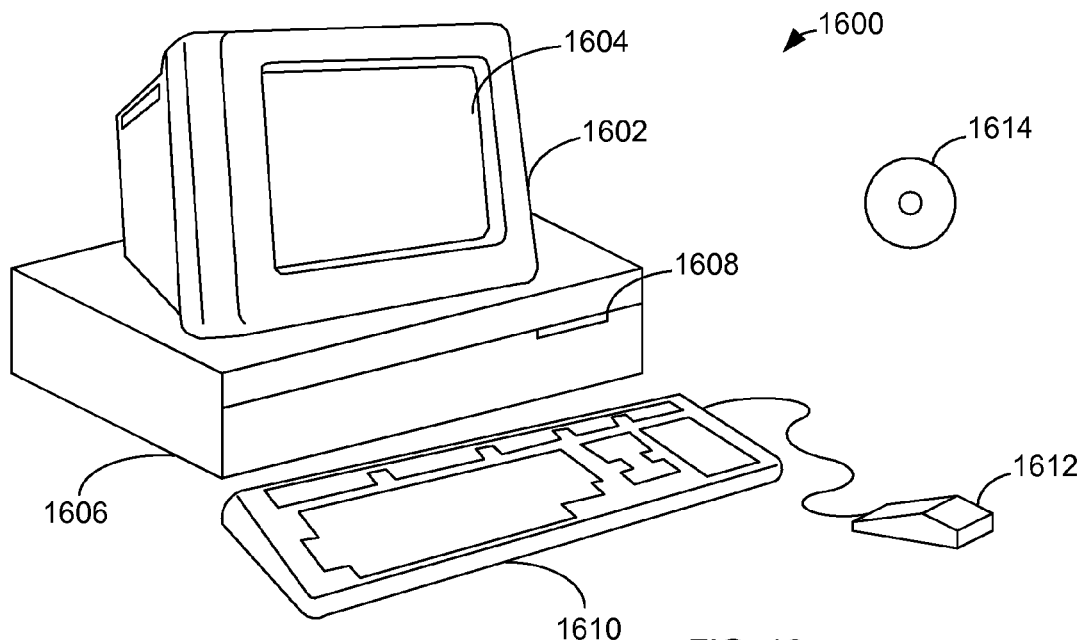
FIGS. 16a and 16b illustrate a computer system, which is suitable for implementing a controller used in embodiments of the present invention.
Figure 16B:
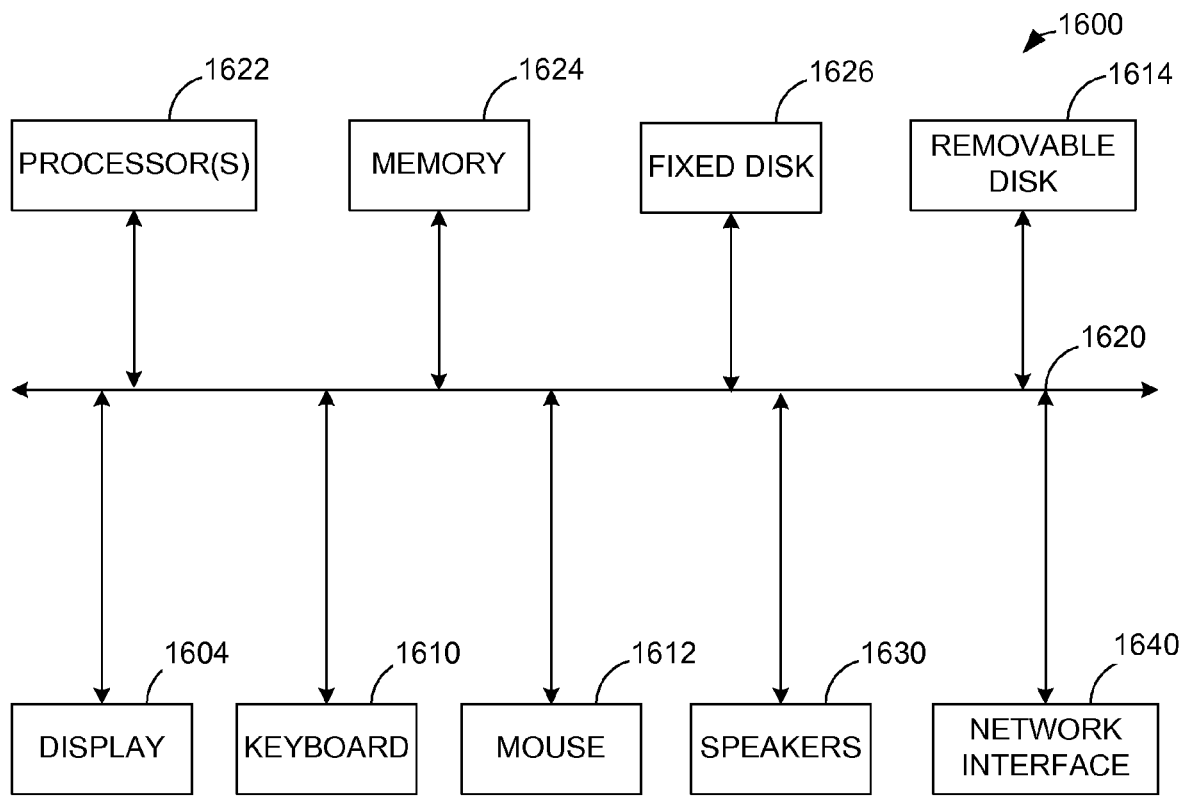

FIGS. 16a and 16b illustrate a computer system 1600, which is suitable for implementing a controller 1512 used in embodiments of the present invention. FIG. 16a shows one possible physical form of the computer system. Of course, the computer system may have many physical forms ranging from an integrated circuit, a printed circuit board, and a small handheld device up to a huge super computer. Computer system 1600 includes a monitor 1602, a display 1604, a housing 1606, a disk drive 1608, a keyboard 1610, and a mouse 1612. Disk 1614 is a computer-readable medium used to transfer data to and from computer system 1600.

FIG. 16b is an example of a block diagram for computer system 1600. Attached to system bus 1620 are a wide variety of subsystems. Processor(s) 1622 (also referred to as central processing units, or CPUs) are coupled to storage devices, including memory 1624. Memory 1624 includes random access memory (RAM) and read-only memory (ROM). As is well known in the art, ROM acts to transfer data and instructions uni-directionally to the CPU and RAM is used typically to transfer data and instructions in a bi-directional manner. Both of these types of memories may include any suitable of the computer-readable media described below. A fixed disk 1626 is also coupled bi-directionally to CPU 1622; it provides additional data storage capacity and may also include any of the computer-readable media described below. Fixed disk 1626 may be used to store programs, data, and the like and is typically a secondary storage medium (such as a hard disk) that is slower than primary storage. It will be appreciated that the information retained within fixed disk 1626 may, in appropriate cases, be incorporated in standard fashion as virtual memory in memory 1624. Removable disk 1614 may take the form of the computer-readable media described below.

CPU 1622 is also coupled to a variety of input/output devices, such as display 1604, keyboard 1610, mouse 1612, and speakers 1630. In general, an input/output device may be any of: video displays, track balls, mice, keyboards, microphones, touch-sensitive displays, transducer card readers, magnetic or paper tape readers, tablets, styluses, voice or handwriting recognizers, biometrics readers, or other computers. CPU 1622 optionally may be coupled to another computer or telecommunications network using network interface 1640. With such a network interface, it is contemplated that the CPU might receive information from the network, or might output information to the network in the course of performing the above-described method steps. Furthermore, method embodiments of the present invention may execute solely upon CPU 1622 or may execute over a network such as the Internet in conjunction with a remote CPU that shares a portion of the processing.

In addition, embodiments of the present invention further relate to computer storage products with a computer-readable medium that has computer code thereon for performing various computer-implemented operations. The media and computer code may be those specially designed and constructed for the purposes of the present invention, or they may be of the kind well known and available to those having skill in the computer software arts. Examples of computer-readable media include, but are not limited to: magnetic media such as hard disks, floppy disks, and magnetic tape; optical media such as CD-ROMs and holographic devices; magneto-optical media such as floptical disks; and hardware devices that are specially configured to store and execute program code, such as application-specific integrated circuits (ASICs), programmable logic devices (PLDs) and ROM and RAM devices. Examples of computer code include machine code, such as produced by a compiler, and files containing higher level code that are executed by a computer using an interpreter. Computer readable media may also be computer code transmitted by a computer data signal embodied in a carrier wave and representing a sequence of instructions that are executable by a processor.

Dynamic Magnetic Resonance Imaging

Methods

Figure 18:
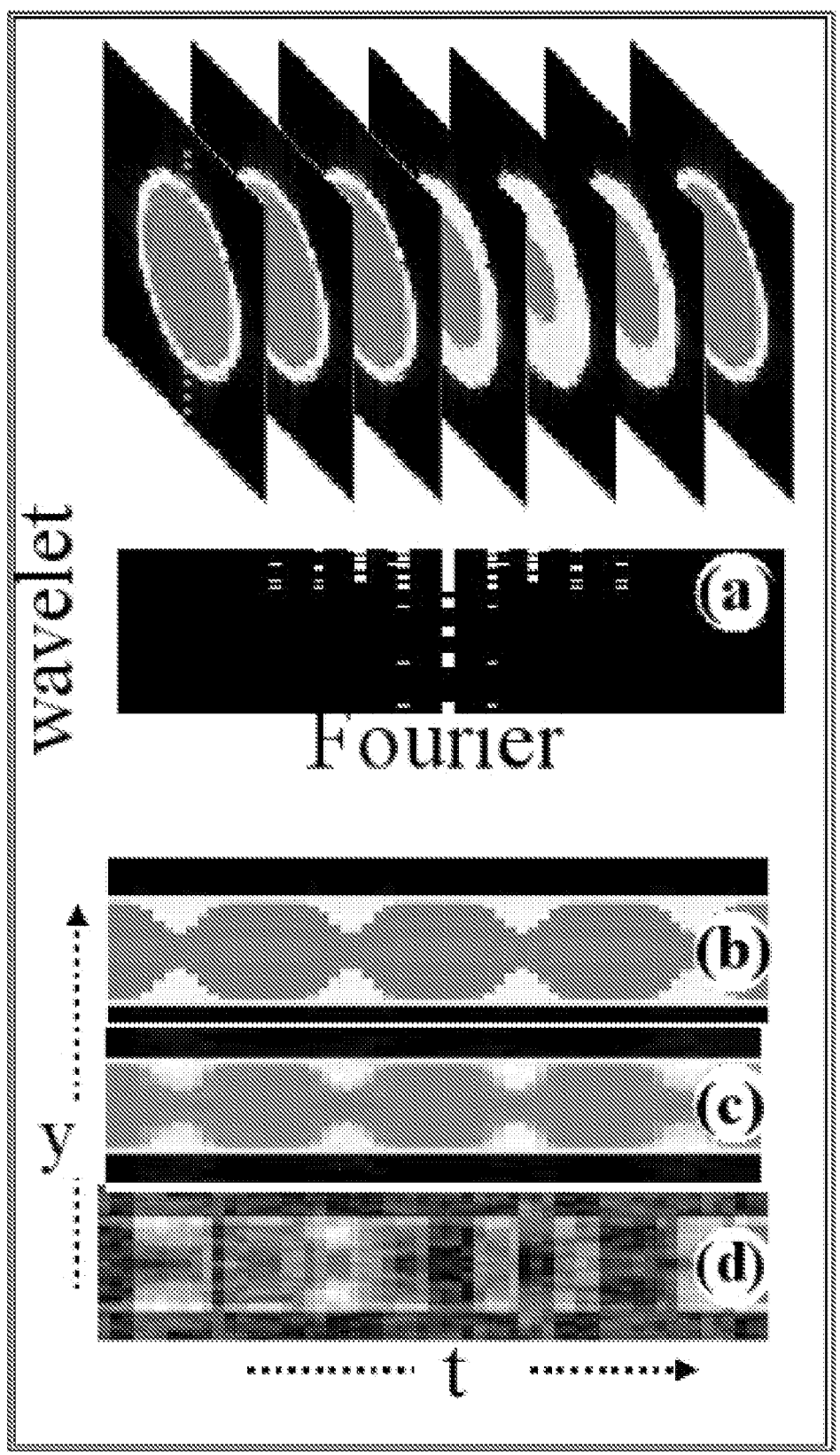
FIGS. 18a-d illustrate reconstruction of dynamic data.

For dynamic heart imaging, an embodiment of the invention uses the wavelet transform in the spatial dimension and the Fourier transform in the temporal. Wavelets sparsify medical images whereas the Fourier transform sparsifies smooth or periodic temporal behavior. Moreover, with random k-t sampling, aliasing is extremely incoherent in this particular transform domain. To validate this approach a simulated dynamic scene with periodic heart-like motion was considered. A random phase-encode ordered Cartesian acquisition was simulated with a TR=4 ms, 64 pixels, acquiring a total of 1024 phase encodes (4.096 sec), as shown in FIGS. 18a-d. The data was reconstructed at a frame rate of 15 frames per second (FPS) (a 4-fold acceleration factor) using the $L_1$ reconstruction scheme implemented with non-linear conjugate gradients, as shown in FIG. 18b. The result was compared to a sliding window reconstruction (64 phase encodes in length). To further validate our method we considered a Cartesian balanced-SSFP dynamic heart scan (TR=4.4, TE=2.2, $\alpha$=60°, res=2.5 mm, slice=9 mm). 1152 randomly ordered phase encodes (5 sec) where collected and reconstructed using the $l_1$ scheme at a 7-fold acceleration (25FPS).

Result was compared to a sliding window (64 phase encodes) reconstruction, as shown in FIG. 18c. The experiment was performed on a 1.5 T GE Signa scanner using a 5 inch surface coil.

FIG. 18a shows the transform domain of the cross-section of simulated dynamic data is truly sparse. FIG. 18b shows the ground truth cross-section of the simulated dynamic data. FIG. 18c shows the k-t sparse reconstruction from random phase encode ordering with 4-fold acceleration. FIG. 18d shows a sliding window (64) reconstruction from the random phase encode ordering.

Figure 19:
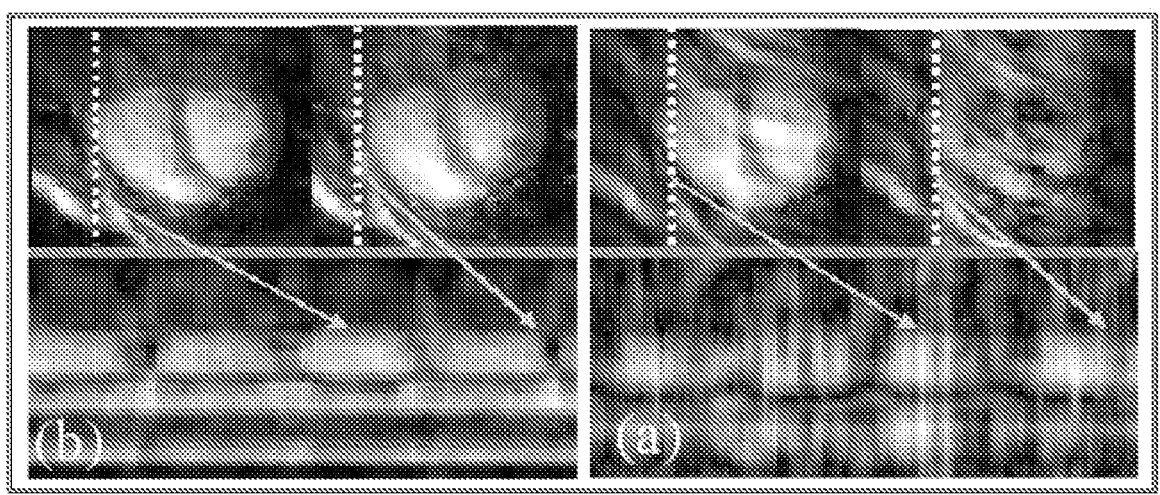
FIGS. 19a-b illustrate dynamic SSFP heart imaging with randomized ordering.

FIG. 19a shows a sliding window (64) reconstruction for a dynamic SSFP heart imaging with randomized ordering and 7-fold acceleration at 25 frames per second. FIG. 19b shows a k-t sparse reconstruction. The signal is recovered in both time and space using the k-t sparse method. The images show two frames of the heart phase and a cross-section evolution in time.

FIGS. 18a-d and FIGS. 19a-b illustrate the simulated phantom and actual dynamic heart scan reconstructions. Note, that even at 4 to 7-fold acceleration, this embodiment of the invention is able to recover the motion, preserving the spatial frequencies and suppressing aliasing artifacts. This method can be easily extended to arbitrary trajectories and can also be easily integrated with other acceleration methods such as phase constrained partial k-space and SENSE. A Matlab™ implementation was to reconstruct a 64×64×64 scene in an hour. This can be improved by using an embodiment of the invention. Other proposed linear methods exploit known or measured spatio-temporal structure. The advantage of this embodiment of the invention is that the signal need not have a known structure, only sparsity, which is a very realistic assumption in dynamic medical images. Therefore, a training set is not required.

Dynamic imaging of time-varying objects is challenging because of the spatial and temporal sampling requirements of the Nyquist criterion. Often temporal resolution is traded off against spatial resolution. Artifacts appear in the traditional linear reconstruction when the Nyquist criterion is violated.

For an embodiment for dynamic imaging of time-varying objects undergoing quasi-periodic changes, heart imaging may be used as an example. Since heart motion is quasi-periodic, the time series of intensity in a single voxel is sparse in the temporal frequency domain (see FIG. 20). At the same time, a single frame of the heart "movie" is sparse in the wavelet domain. A simple transform can exploit both effects by applying a spatial wavelet transform followed by a temporal Fourier transform, as shown in FIG. 21a.

Figure 21:
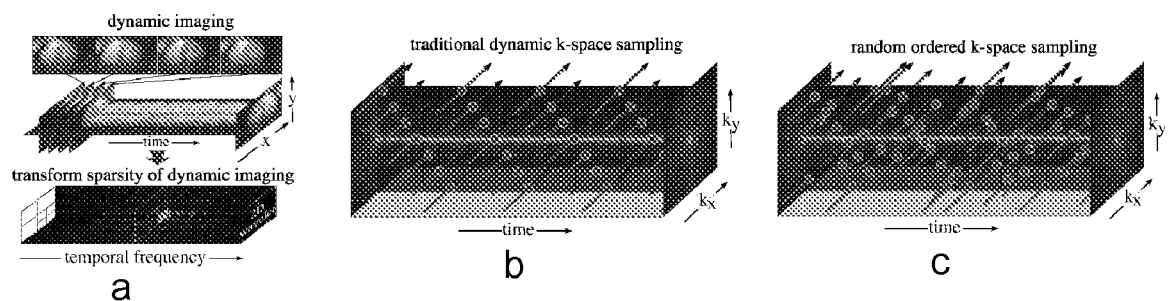
FIGS. 21a-c illustrate different sampling patterns.

FIG. 21a shows that the dynamic MRI is a multidimensional signal with two or three spactial coordinates and times as an additional dimension. The dynamic images have a sparse representation in an appropriate transform domain. FIG. 21b shows a traditional k-t sequential sampling. FIG. 21c shows that random ordering is an efficient way to incoherently sample the k-t space.

The natural sparsity of dynamic sequences can be exploited to reconstruct a time-varying object sampled at significantly sub-Nyquist rates. A Cartesian sampling scheme that acquires a single line in k-space for each time slice, following an orderly progression through the space of lines as time progresses is shown in FIG. 21b. For the desired FOV and resolution it is impossible to meet the spatial-temporal Nyquist rate using this scheme.

In fact, this approach is particularly inefficient for dynamic imaging with traditional acquisition and reconstruction methods. Instead, the embodiment of the invention makes one change, which is to make the k-space line ordering random instead of orderly. The random ordering comes much closer to randomly sampling k-t space, as shown in FIG. 21c, and the sampling operator becomes much less coherent with the sparsifying transform.

Figure 22:
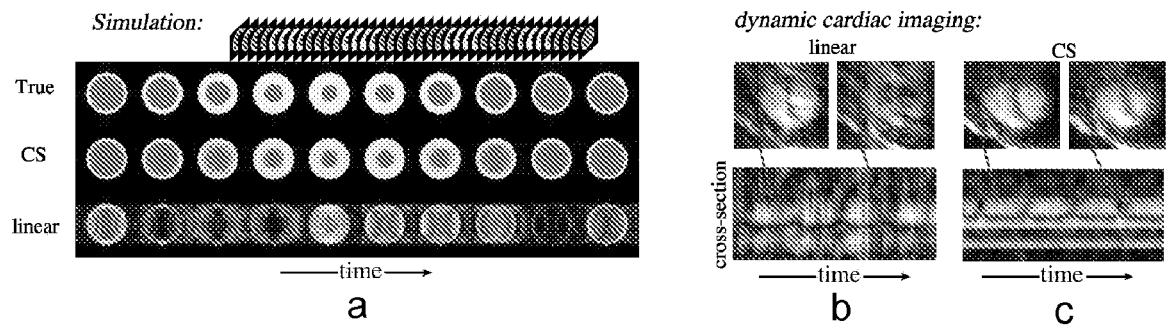
FIGS. 22a-c illustrate dynamic imaging of quasi-periodic change.

FIGS. 22a-c shows results from using an embodiment of the invention. The first result used synthetic data: a motion phantom, periodically changing in a cartoon of heart motion. FIG. 22a depicts an image sequence reconstructed from a sampling rate four times slower than the Nyquist rate, using randomly ordered acquisition and nonlinear reconstruction. The second result involved dynamic real-time acquisition of heart motion. The given FOV (16 cm), resolution (2.5 mm), and repetition time (4.4 ms) allows a Nyquist rate of 3.6 frames/s. This leads to temporal blurring and artifacts in the traditionally reconstructed image, as shown in FIG. 22b. By instead using random ordering and CS reconstruction an embodiment of the invention was able to recover the dynamic sequence at the much higher rate of 25 frames/s with significantly reduced image artifact, as shown in FIG. 22c.

Appendix I: Non-Linear Conjugate-Gradient Solution of the CS Optimization Procedure.

Eq. 4 poses a constrained convex optimization problem. Consider the unconstrained problem in so-called Lagrangian form:

$$\underset{m}{\operatorname{argmin}} \|F_u m - y\|2^2 + \lambda \|\Psi m\|1 \tag{7}$$

where $\lambda$ is a regularization parameter that determines the trade-off between the data consistency and the sparsity. As is well-known, the parameter $\lambda$ can be selected appropriately such that the solution of Eq. 7 is exactly as Eq. 4. The value of $\lambda$ can be determined by solving Eq. 7 for different values, and then choosing $\lambda$ so that $\|Fum-y\|2 \approx \epsilon$. Alternatively, $\lambda$ can be chosen empirically in a similar way.

An embodiment of the invention solves Eq. 7 using a non-linear conjugate gradient descent algorithm with backtracking line search where f(m) is the objective as defined in Eq. 7.

The Algorithm is as Follows:
1. Initialization
   (a) Set k=0
   (b) Set $m_0$=0
   (c) Set $g_0 = \nabla f(m_0)$
   (d) Set $\Delta m_0 = -g_0$
2. Iterations.
   (a) Backtracking line-search ($\alpha \in (0, 0.5)$, $\beta \in (0, 1)$)
      i. Let t=0
      ii. while $f(m_k + t\Delta m_k) > f(m_k) + \alpha t g_k^T \Delta m_k$, $t = \beta t$
   (b) Set $m_{k+1} = m_k + t\Delta m_k$.
   (c) Set $g_{k+1} = \nabla f(m_{k+1})$.
   (d) Set $\gamma = \dfrac{g_{k+1}^T g_{k+1}}{\|g_k\|^2}$.
   (e) Set $\Delta m_{k+1} = -g_{k+1} + \gamma \Delta m_k$.
   (f) Set k=k+1

(g) Stopping Criteria:
  i. if $\|g_k\| < TOL_{grad}$
  ii. if $k > N_{maxIter}$
(h) Repeat 2a The conjugate gradient requires the computation of $\nabla f(m)$ which is, $$\nabla f(m) = 2F_u^*(F_u m - y) + \lambda \nabla \|\Psi m\|_1 \quad (8)$$

The l1 norm is the sum of absolute values. The absolute value function however, is not a smooth function and as a result Eq. 8 is not well defined for all values of m. The absolute value is approximated with a smooth function by using the relation $|x| \approx \sqrt{x^* x + \mu}$, where $\mu$ is a positive smoothing parameter. With this approximation, $$\frac{d|x|}{dx} \approx \frac{x}{\sqrt{x^* x + \mu}}.$$

Now, let W be a diagonal matrix with the diagonal elements $w_i = \sqrt{(\psi m)_i^*(\psi m)_i + \mu}$. Equation 8 can be approximated by, $$\nabla f(m) \approx 2F_u^*(F_u m - y) + \psi^* W^{-1} \psi m \quad (9)$$

In practice, Eq. 9 is used with a smoothing factor $\mu \in [10^{-6}, 10^{-15}]$.

Appendix II: Derivation of the Interference Standard Deviation Formula

Eq. 1 is easily derived. The total energy in the PSF is $$\frac{N}{D}$$

and the energy of the main lobe is $$\left(\frac{N}{D}\right)^2.$$

The off-center energy is therefore $$\frac{N}{D} - \cdot \left(\frac{N}{D}\right)^2$$

Normalizing by the number of off-center pixels and also by the main lobe's energy we get Eq. 1.

Appendix III: Calculating the Transform Point Spread Function (TPSF)

Let $\psi_n$ be the $n^{th}$ basis element of the sparsifying transform, for example, $\psi_n$ may be a wavelet or a DCT coefficient. Let $S_n^u = F_u \psi_n$ denote the vector of measurements which would be generated for undersampled k-space data based on an object consisting purely of that basis element. $S_n^u$ is computed by returning from the transform domain to the image domain and then computing the undersampled k-space data. The transform point spread function TPSF(m; n) measures leakage of energy from coefficient n to coefficient m due to undersampling. It is defined by $$TPSF(n; m) = \frac{\langle S_n^u, S_m^u \rangle}{\|S_n^u\| \|S_m^u\|} \quad (10)$$

While this invention has been described in terms of several preferred embodiments, there are alterations, permutations, modifications and various substitute equivalents, which fall within the scope of this invention. It should also be noted that there are many alternative ways of implementing the methods and apparatuses of the present invention. It is therefore intended that the following appended claims be interpreted as including all such alterations, permutations, modifications, and various substitute equivalents as fall within the true spirit and scope of the present invention.

What is claimed is:

1. A method of dynamic resonance imaging, comprising:
  a) applying a magnetic resonance imaging excitation;
  b) acquiring data in 2 or 3 spatial frequency dimensions, and time, where an acquisition order in at least one spatial frequency dimension and the time dimension are in a pseudo-random order, and
  c) using the pseudo-random order and enforced sparsity constraints to reconstruct a time series of dynamic magnetic resonance images.

2. The method, as recited in claim 1, wherein the using the pseudo-random order and enforced sparsity constraints to construct dynamic magnetic resonance images, comprises performing an optimization that enforces sparcity of the time-series images in a transform domain, which uses a sparcifying transform.

3. The method, as recited in claim 2, wherein the number of pseudo-random acquisitions is less than half of the total number of acquisitions for a full data set that would completely define an image.

4. The method, as recited in claim 3, wherein a defined number n of k space values would completely define an image, wherein no more than ⅓ n k-space acquisitions are collected.

5. The method, as recited in claim 4, wherein the using the pseudo-random order and enforced sparsity constraints to reconstruct dynamic magnetic resonance images uses a solution for the following non-linear convex optimization:

$$\text{minimize} \quad \|\Psi_s \Psi_t m\|_1$$
$$\text{s.t.} \quad \|F_u m - y\|_2 < \varepsilon.$$

6. The method of claim 5, wherein the sparcifying transform is an image compression transform.

7. The method, as recited in claim 6, wherein the dynamic magnetic resonance images are created in real time.

8. The method, as recited in claim 6, further comprising displaying the dynamic magnetic resonance images, wherein the dynamic magnetic resonance images are displayed in real time.

9. The method, as recited in claim 6, wherein the sparcifying transform is a wavelet transform in the spatial dimension and a Fourier transform in a temporal direction.

10. The method of claim 2, wherein the sparcifying transform from claim 2 is an image compression transform.

11. The method, as recited in claim 1, wherein the using the pseudo-random order to reconstruct dynamic magnetic resonance images uses a solution for the following non-linear convex optimization:

$$\text{minimize } \|\Psi_s \Psi_t m\|_1$$
$$\text{s.t.} \quad \|F_u m - y\|_2 < \varepsilon.$$

12. The method, as recited in claim 1, wherein the number of pseudo-random acquisitions is less than half of the total number of acquisitions for a full data set that would completely define an image.

13. The method, as recited in claim 1, wherein a defined number n of k space values would completely define an image, wherein no more than ⅓ n k-space acquisitions are collected.

14. The method, as recited in claim 1, further comprising displaying the series of dynamic magnetic resonance images.

15. A magnetic resonance imaging apparatus, comprising:
a magnetic resonance imaging excitation and detection system; and
a controller electrically connected to the magnetic resonance imaging excitation and detection system, comprising:
a display;
at least one processor; and
computer readable media, comprising:
computer readable code for applying a magnetic resonance imaging excitation;
computer readable code for acquiring data in 2 or 3 spatial frequency dimensions, and time, where an acquisition order in at least one spatial frequency dimension and the time dimension are in a pseudo-random order;
computer readable code for using the pseudo-random order and enforced sparsity constraints to reconstruct a time series of dynamic magnetic resonance images; and
computer readable code for displaying the time series of dynamic magnetic resonance images on the display.

16. The magnetic resonance imaging apparatus, as recited in claim 15, wherein the computer readable code for using the pseudo-random order and enforced sparsity constraints to construct dynamic magnetic resonance images, comprises computer readable code for performing an optimization that enforces sparcity of the time-series images in a transform domain, which uses a sparcifying transform.

17. The magnetic resonance imaging apparatus, as recited in claim 16, wherein the number of pseudo-random acquisitions is less than half of the total number of acquisitions for a full data set that would completely define an image and wherein a defined number n of k space values would completely define an image, wherein no more than ⅓ n k-space acquisitions are collected.

18. The magnetic resonance imaging apparatus, as recited in claim 17, wherein the computer readable code for using the pseudo-random order and enforced sparsity constraints to reconstruct dynamic magnetic resonance images uses the solution for the following non-linear convex optimization:

$$\text{minimize } \|\Psi_s \Psi_t m\|_1$$
$$\text{s.t.} \quad \|F_u m - y\|_2 < \varepsilon.$$

19. The magnetic resonance imaging apparatus of claim 18, wherein the sparcifying transform is an image compression transform.

20. The magnetic resonance imaging apparatus, as recited in claim 16, wherein the sparcifying transform is a wavelet transform in the spatial dimension and a Fourier transform in a temporal direction.

* * * * *